US012648210B2

(12) United States Patent
Murasaki

(10) Patent No.: US 12,648,210 B2
(45) Date of Patent: Jun. 2, 2026

(54) SEMICONDUCTOR DEVICE

(71) Applicant: ROHM CO., LTD., Kyoto (JP)

(72) Inventor: Kohei Murasaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 784 days.

(21) Appl. No.: 17/606,957

(22) PCT Filed: May 19, 2020

(86) PCT No.: PCT/JP2020/019805
§ 371 (c)(1),
(2) Date: Oct. 27, 2021

(87) PCT Pub. No.: WO2020/246230
PCT Pub. Date: Dec. 10, 2020

(65) Prior Publication Data
US 2022/0216313 A1     Jul. 7, 2022

(30) Foreign Application Priority Data

Jun. 4, 2019     (JP) ................................. 2019-104630

(51) Int. Cl.
H10D 30/68          (2025.01)
H10D 12/00          (2025.01)
(Continued)

(52) U.S. Cl.
CPC ......... H10D 64/513 (2025.01); H10D 12/481 (2025.01); H10D 12/491 (2025.01);
(Continued)

(58) Field of Classification Search
CPC ......... H10D 84/401–409; H10D 12/411–491; H10D 12/031–038; H10D 62/141–148;
(Continued)

(56) References Cited

U.S. PATENT DOCUMENTS

2013/0175574 A1     7/2013   Matsuura
2014/0054644 A1     2/2014   Hikasa
(Continued)

FOREIGN PATENT DOCUMENTS

JP          2013140885          7/2013
JP          2017005117          1/2017
(Continued)

OTHER PUBLICATIONS

International Preliminary Report on Patentability issued for International Patent Application No. PCT/JP2020/019805, Date of mailing: Dec. 16, 2021, 12 pages including English translation.
(Continued)

*Primary Examiner* — Moin M Rahman
(74) *Attorney, Agent, or Firm* — XSENSUS LLP

(57)          ABSTRACT
A semiconductor device includes: a semiconductor layer of a first conductivity type having a first main surface and a second main surface; an active region defined in a surface layer of the first main surface; an outer region defined outside the active region in the surface layer; and a main junction region of a second conductivity type provided in the outer region as surrounding the active region. The semiconductor device includes: a floating region of the second conductivity type provided in an electrically floating state in the active region; a region isolation trench structure which isolates the floating region in the surface layer; an outer isolation trench structure disposed in spaced relation from the region isolation trench structure to define the main junction region outward thereof; and an intervening region disposed between the region isolation trench structure and the outer isolation trench structure.

17 Claims, 9 Drawing Sheets

(51) Int. Cl.
    *H10D 62/10*     (2025.01)
    *H10D 64/27*     (2025.01)

(52) U.S. Cl.
    CPC ....... *H10D 30/689* (2025.01); *H10D 30/6894*
        (2025.01); *H10D 62/127* (2025.01)

(58) Field of Classification Search
    CPC ......... H10D 84/40–409; H10D 12/035; H10D
        12/491; H10D 18/221; H10D
      12/032–038; H10D 12/441–491; H10D
        12/038; H10D 62/133–136; H10D
        64/231; H10D 64/513; H10D 12/481;
        H10D 30/689; H10D 30/6894; H10D
        62/127; H10D 30/665; H10D 30/668;
        H10D 64/232; H10D 64/117; H10D
        64/256; H10D 64/519; H10D 62/106;
        H10D 62/157; H01L 21/76224; H01L
      27/0924; H01L 21/31051; H01L 27/0207;
        H01L 29/0649; H01L 21/32115; H01L
        21/823828; H01L 29/66681; H01L
        21/823821; H01L 29/0657; H01L
     29/4966; H01L 29/0882; H01L 29/66545;
        H01L 29/4983; H01L 29/785; H01L
     29/1037; H01L 29/0653; H01L 29/66659;
        H01L 29/7835; H01L 29/66689; H01L
        29/7816; H01L 21/28088; H01L
        21/823807; H01L 21/823418; H01L
        21/823412; H01L 29/66439; H01L
        29/66795; H01L 27/0886; H01L
        29/78684; H01L 21/823814; H01L
        29/78618; H01L 29/42392; H01L
        29/78696; H01L 29/78654; H01L
        2029/7858; H01L 21/0245; H01L
     29/4916; H01L 29/861; H01L 29/0696;
        H01L 29/407; H01L 29/66734; H01L
        29/7804; H01L 29/7813; H01L 29/16;
      H01L 21/82285; H01L 21/823487; H01L
        21/823885; H01L 27/0821; H01L
        27/0828; H01L 27/10864; H01L
        27/10876; H01L 29/66272; H01L
        29/66666; H01L 29/66674; H01L
     29/66712; H01L 29/732; H01L 29/7327;
        H01L 29/7371; H01L 29/7395; H01L
        29/7788; H01L 29/7827; H01L 29/78642;
        H01L 29/7889; H01L 29/7926; H01L
        29/8083; H01L 29/8122; H01L 29/4236;
        H01L 29/42336; H01L 29/7397; H01L
        29/7398; H01L 29/0878; H01L 29/7811;
        H01L 29/417; H01L 29/0619; H01L
        29/41766; H01L 29/4238; H01L
        29/66325–66348; H01L 29/7393–7398;
        H01L 2924/13055; H01L 29/083–0834;
        H01L 29/6634; H01L 27/0617–0635;
      H01L 27/0705–0738; H01L 27/088–0883;
        H01L 29/1095; G05F 1/463
    See application file for complete search history.

(56)           References Cited

U.S. PATENT DOCUMENTS

| | | | |
|---|---|---|---|
| 2014/0339599 A1* | 11/2014 | Onozawa | H01L 29/42304 |
| | | | 257/139 |
| 2015/0060937 A1* | 3/2015 | Hikasa | H01L 29/0619 |
| | | | 257/139 |
| 2015/0171200 A1 | 6/2015 | Hikasa | |
| 2015/0236144 A1 | 8/2015 | Matsuura | |
| 2016/0086941 A1 | 3/2016 | Hikasa | |
| 2016/0211355 A1 | 7/2016 | Hikasa | |
| 2016/0365433 A1 | 12/2016 | Matsuura | |
| 2017/0154985 A1 | 6/2017 | Matsuura | |
| 2018/0083130 A1 | 3/2018 | Matsuura | |
| 2018/0261680 A1* | 9/2018 | Park | H10D 64/62 |
| 2018/0261693 A1 | 9/2018 | Matsuura | |
| 2019/0206860 A1* | 7/2019 | Kamimura | H10D 62/107 |

FOREIGN PATENT DOCUMENTS

| | | |
|---|---|---|
| JP | 2017212462 | 11/2017 |
| JP | 2019024138 | 2/2019 |
| WO | 2014061619 | 4/2014 |

OTHER PUBLICATIONS

International Search Report and Written Opinion issued for International Patent Application No. PCT/JP2020/019805, Date of mailing: Aug. 25, 2020, 9 pages including English translation of Search Report.

* cited by examiner

SEMICONDUCTOR DEVICE

TECHNICAL FIELD

The present invention relates to a semiconductor device.

BACKGROUND ART

US2013/0175574A1 discloses an IE-type trench gate IGBT including a device chip having a cell formation region and a ring-shaped P-type cell peripheral junction region surrounding the cell formation region (see FIG. 36 in the publication). A number of linear unit cell regions are spread in the cell formation region. The linear unit cell regions each include an active cell region and an inactive cell region. A trench gate electrode is disposed between the active cell region and the inactive cell region. A P-type floating region is provided in the inactive cell region. The P-type floating region is defined by a trench in which the trench gate electrode and an end trench gate electrode connected to the trench gate electrode are buried. The P-type cell peripheral junction region is opposed to the P-type floating region across the end trench gate electrode. The P-type cell peripheral junction region is connected to a metal emitter electrode.

SUMMARY OF THE INVENTION

Problem to be Solved by the Invention

In the structure disclosed in US2013/0175574A1, the P-type cell peripheral junction region and the P-type floating region are opposed to each other, and a spacing therebetween is dependent upon a process accuracy. Therefore, the P-type cell peripheral junction region and the P-type floating region are liable to be joined together. Even with the P-type cell peripheral junction region and the P-type floating region not joined together, a parasitic PNP transistor is liable to occur if the spacing between the P-type cell peripheral junction region and the P-type floating region is small. Therefore, collector current characteristic with respect to gate voltage is liable to be unstable. This may cause, for example, oscillation at around a threshold, resulting in unstable operation.

Solution to Problem

A semiconductor device according to one embodiment of the present invention includes a semiconductor layer of a first conductivity type having a first main surface on one side thereof and a second main surface on the other side thereof. The semiconductor device includes an active region defined in a surface layer of the first main surface of the semiconductor layer. The semiconductor device includes an outer region defined outside the active region in the surface layer of the first main surface of the semiconductor layer. The semiconductor device includes a main junction region of a second conductivity type provided in the outer region as surrounding the active region. The semiconductor device includes a floating region of the second conductivity type provided in an electrically floating state in the active region. The semiconductor device includes a region isolation trench structure which isolates the floating region in the surface layer of the first main surface of the semiconductor layer. The semiconductor device includes an outer isolation trench structure disposed in spaced relation from the region isolation trench structure to define the main junction region outward thereof. The semiconductor device includes an intervening region disposed between the region isolation trench structure and the outer isolation trench structure to intervene between the main junction region and the floating region.

With this arrangement, the region isolation trench structure and the outer isolation trench structure intervene between the main junction region provided outside the active region and the floating region. Further, the intervening region intervenes between these trench structures. Thus, the main junction region and the floating region can be reliably isolated from each other to be thereby prevented from being joined together and from undesirably approaching each other.

The foregoing and other objects, features, and effects of the present invention will become more apparent from the description of the embodiments with reference to the attached drawings.

EMBODIMENTS OF THE INVENTION

Figure 1:
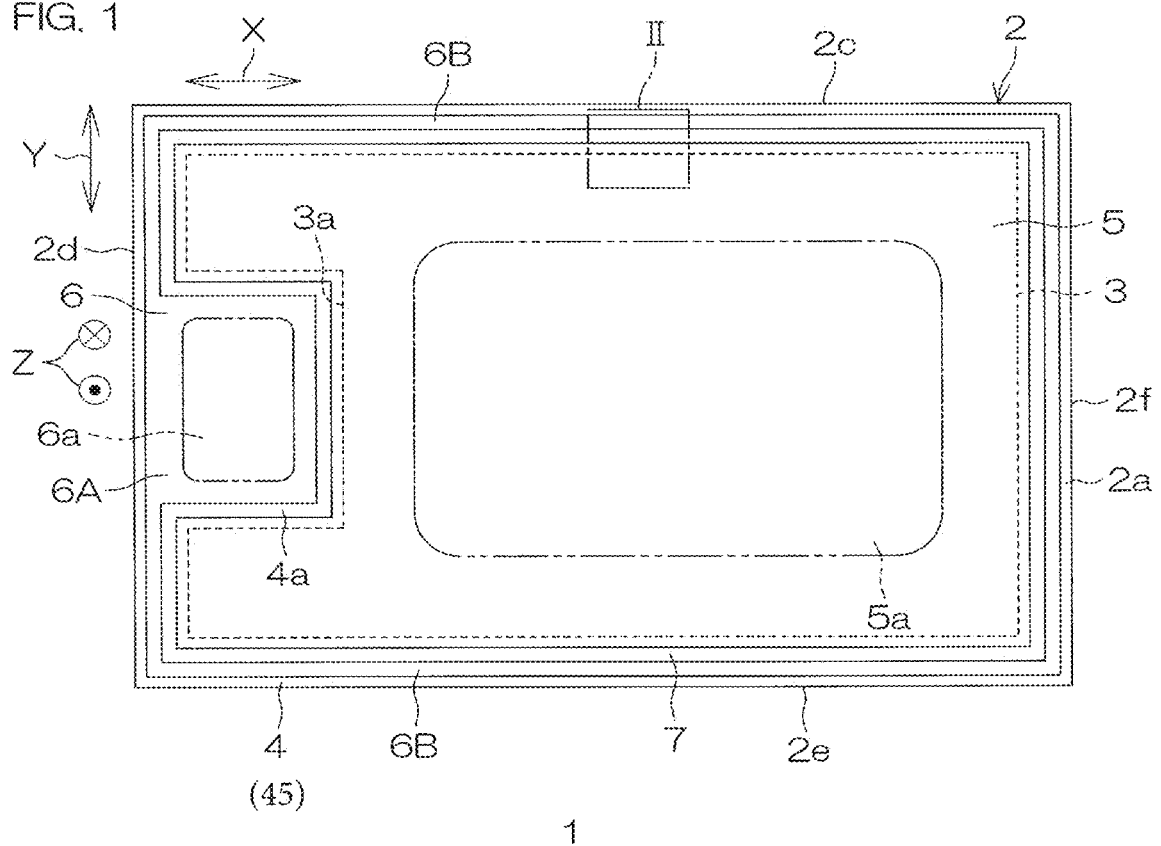
FIG. 1 is a plan view of a semiconductor device according to one embodiment of the present invention.

FIG. 1 is a plan view of a semiconductor device 1 according to one embodiment of the present invention. In this embodiment, the semiconductor device 1 is an electronic component having an IGBT (Insulated Gate Bipolar Transistor).

The semiconductor device 1 includes a chip-like semiconductor layer 2. Specifically, the semiconductor layer 2 has a first main surface 2a on one side thereof, and a second main surface 2b (see FIG. 3) on the other side thereof. The first main surface 2a and the second main surface 2b are flat surfaces. In FIG. 1, the construction of the semiconductor device 1 is illustrated as viewed in plan perpendicularly to the first main surface 2a. In this embodiment, the first main surface 2a and the second main surface 2b are quadrilateral, and more specifically rectangular. The semiconductor layer 2 further has side surfaces 2c, 2d, 2e, 2f (in this embodiment four side surfaces) connecting the first main surface 2a and the second main surface 2b to each other.

In the following description, a direction perpendicular to the first main surface 2a and the second main surface 2b, i.e., a direction parallel to the normal lines of the first main surface 2a and the second main surface 2b, is referred to as "normal line direction Z" of the semiconductor layer 2 for convenience. Further, "as viewed in the normal line direction Z" is referred to as "as viewed in plan." For convenience, a direction perpendicular to the normal line direction Z and parallel to the side surface 2c is referred to as "first direction X" while a direction perpendicular to both the normal line direction Z and the first direction X (a direction parallel to the side surface 2d next to the side surface 2c) is referred to as "second direction Y."

The semiconductor layer 2 includes an active region 3 and an outer region 4 (peripheral region). The active region 3 and the outer region 4 are defined in the first main surface 2a of the semiconductor layer 2.

The active region 3 is defined in inwardly spaced relation from the side surfaces 2c to 2f of the semiconductor layer 2 in a center portion of the semiconductor layer 2 as viewed in plan. The active region 3 may have a quadrilateral shape (more specifically, a rectangular shape) having four edges parallel to the four side surfaces 2c to 2f, respectively, of the semiconductor layer 2 as viewed in plan. In this embodiment, the active region 3 has a recess 3a which is recessed inward from a middle portion of one of the four edges of the rectangular shape.

The outer region 4 is an area outside the active region 3. The outer region 4 extends in a band shape along the periphery of the active region as viewed in plan. The outer region 4 surrounds the active region 3 as viewed in plan. More specifically, the outer region 4 has an endless shape (a rectangular ring shape) surrounding the active region 3 as viewed in plan. In this embodiment, the outer region 4 has a projection 4a projecting inward toward the active region 3 in conformity with the recess 3a of the active region 3.

A film-shaped emitter electrode 5 substantially entirely covers the active region 3. An emitter pad region 5a is defined in a center portion of the emitter electrode 5. The emitter pad region 5a serves as a bonding pad to which a bonding wire is bonded.

A film-shaped gate electrode 6 is disposed in the outer region 4. The gate electrode 6 and the emitter electrode 5 are separated from each other by a gap 7 (in this embodiment, a slit-shaped gap) to be thereby electrically insulated from each other. The gate electrode 6 includes a gate pad portion 6A provided in conformity with the projection 4a of the outer region 4, and a gate wiring 6B extending from the gate pad portion 6A. The gate wiring 6B is also referred to as gate finger. In this embodiment, the gate pad portion 6A has a rectangular shape as viewed in plan. A gate pad region 6a is defined in a center portion of the gate pad portion 6A. The gate pad region 6a serves as a bonding pad to which a bonding wire is bonded. The gate wiring 6B extends in a band shape along the outer region 4. In this embodiment, the gate wiring 6B includes two gate wirings 6B connected to the gate pad portion 6A. The gate wirings 6B each extend along the side surface 2d of the semiconductor layer 2, and are each bent in an L-shape as viewed in plan to extend along the side surface 2c, 2e next to the side surface 2d.

Figure 2:
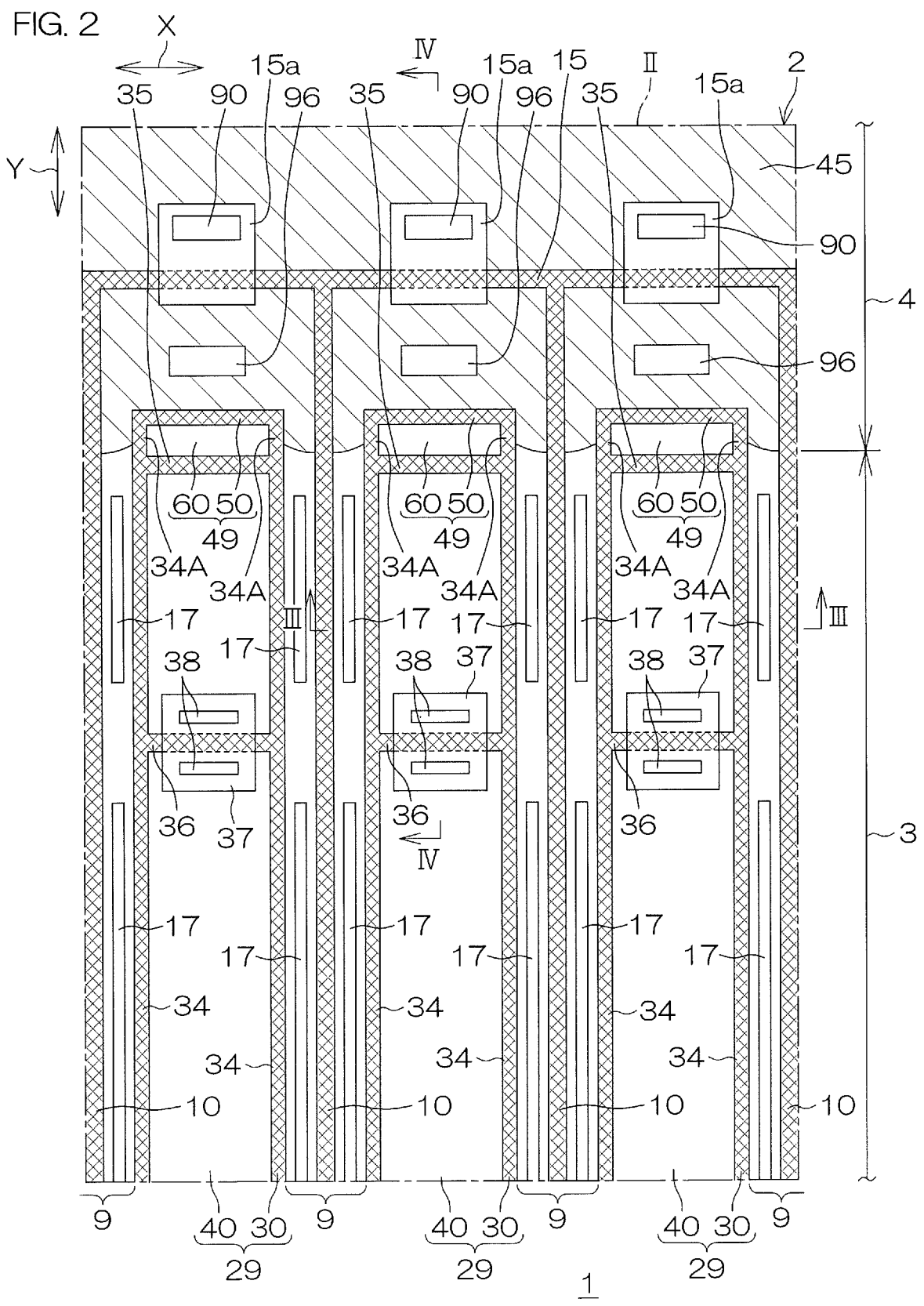
FIG. 2 is an enlarged plan view for describing an arrangement around a boundary between an active region and an outer region, illustrating a surface structure of a semiconductor layer in a region II shown in FIG. 1.

FIG. 2 is an enlarged plan view for describing an arrangement around a boundary between the active region 3 and the outer region 4, illustrating the configuration of a surface (the first main surface 2a) of the semiconductor layer 2 in a region II shown in FIG. 1. More precisely, FIG. 2 is an enlarged plan view in which the emitter electrode 5, the gate electrode 6, and an interlevel dielectric film and the like provided in the first main surface 2a of the semiconductor layer 2 are omitted.

In the outer region 4, a main junction region (peripheral junction region) is provided in a surface layer (a region present inward of the first main surface 2a, hereinafter the same applies) of the semiconductor layer 2. As hatched in FIG. 2, the main junction region 45 is defined as surrounding the active region 3 from outside as viewed in plan. More specifically, the main junction region 45 has a ring shape (endless shape) surrounding the active region as viewed in plan. The main junction region 45 serves as a terminal structure of the semiconductor layer 2 to suppress electric field concentration which may otherwise occur due to a depletion layer spreading in a reverse bias period.

A plurality of trench gate structures 10 (which are double-hatched for clarity) are provided in the semiconductor layer 2. The trench gate structures 10 each extend, for example, linearly in the second direction Y. The trench gate structures 10 are spaced from each other in the first direction X in parallel relation. A pair of region isolation trench structures 30 (which are double-hatched for clarity) are disposed on opposite sides of each of the trench gate structures 10 with respect to the first direction X. The region isolation trench structures 30 each extend along the trench gate structures 10. In this embodiment, the region isolation trench structures 30 each extend in the second direction Y. A FET (Field Effect Transistor) structure region 9 is defined between each adjacent pair of region isolation trench structures 30 disposed on the opposite sides of the trench gate structure 10 as viewed in plan.

The region isolation trench structures 30 are each located between a pair of trench gate structures 10 disposed in adjacent relation with respect to the first direction X. The region isolation trench structures 30 each define a p-type floating region 40. The floating region 40 is opposed to the FET structure region 9 across the region isolation trench structure 30. In this embodiment, the region isolation trench structures 30 each include two main isolation trench structures 34 extending linearly along the trench gate structures 10. The floating region 40 is defined between the two main isolation trench structures 34. The region isolation trench structures 30 each further include end connection trench structures 35 which each connect corresponding ones of opposite ends of the two main isolation trench structures 34. The floating region 40 is located in an area defined by the end connection trench structures 35 and the main isolation trench structures 34. The end connection trench structures each extend linearly perpendicularly to the lengths of the trench gate structures 10, i.e., in the first direction X. Therefore, the region isolation trench structures 30 each define the rectangular floating region 40 therein as viewed in plan.

The two main isolation trench structures 34 disposed between the two trench gate structures 10 disposed in adjacent relation with respect to the first direction X are also connected to each other in the floating region 40. Specifically, an intermediate connection trench structure 36 connecting the two main isolation trench structures to each other is disposed in the floating region 40. The intermediate connection trench structure 36 has a linear shape as viewed in plan. The intermediate connection trench structure 36 extends in the first direction X across the floating region 40.

An isolation lead electrode layer 37 is disposed in association with the intermediate connection trench structure 36 so as to be connected to the intermediate connection trench structure 36. The isolation lead electrode layer 37 is disposed across the intermediate connection trench structure in the second direction Y. In this embodiment, the isolation lead electrode layer 37 has a rectangular shape as viewed in plan. An isolation trench contact 38 is provided on the isolation lead electrode layer 37. The isolation trench contact 38 is disposed immediately above the floating region 40. The isolation trench contact 38 connects the isolation lead electrode layer 37 to the emitter electrode 5, whereby the region isolation trench structure 30 is electrically connected to the emitter electrode 5 via the intermediate connection trench structure 36 and the isolation lead electrode layer 37.

The isolation trench contact 38 is disposed offset from the intermediate connection trench structure 36 on the isolation lead electrode layer 37. In this embodiment, the isolation trench contact 38 includes a plurality of isolation trench contacts 38. More specifically, the plural isolation trench contacts 38 (in this embodiment, two isolation trench contacts 38) are disposed on opposite sides of the intermediate connection trench structure 36 with respect to the second direction Y.

Outer isolation trench structures 50 are each disposed to be spaced from the floating region 40 in the second direction Y. More specifically, the outer isolation trench structures 50 are each spaced outward from the end connection trench structure 35 in the second direction Y. The outer isolation trench structure 50 has a linear shape. The outer isolation trench structure 50 is parallel to the end connection trench structure 35.

Opposite ends of the outer isolation trench structure 50 are respectively connected to main isolation trench structure extension portions 34A. The main isolation trench structure extension portions 34A respectively extend outward from the main isolation trench structures 34 linearly in the second direction Y. The main isolation trench structure extension portions 34A each have the same configuration as the main isolation trench structure (see FIG. 3). The main isolation trench structure extension portions 34A are exemplary connection trench structures that connect the region isolation trench structure 30 to the outer isolation trench structure 50. Thus, an intervening region 60 is defined in a surface layer of the semiconductor layer by the pair of main isolation trench structure extension portions 34A, the end connection trench structure 35 and the outer isolation trench structure 50.

In this embodiment, the main junction region is a p-type region. The main junction region 45 contacts the outer isolation trench structure 50 from the outer side. Further, the main junction region contacts the main isolation trench structure extension portions 34A from sides opposite from the intervening region 60. The main junction region 45 contacts the FET structure region 9 from the outer side.

The trench gate structures 10 each extend to the outer region 4 beyond the outer isolation trench structures 50 in the second direction Y. That is, the opposite ends of each of the trench gate structures 10 are located outward of the outer isolation trench structures 50 with respect to the second direction Y. The opposite ends of each of the trench gate structures 10 are respectively connected to a pair of outer trench gate structures 15 (only one of which are shown in FIG. 2). Thus, the plural trench gate structures 10 are connected to each other by the outer trench gate structures 15. That is, the outer trench gate structures 15 serve as a trench gate connection structure that connects the plural trench gate structures 10 together. The outer trench gate structures 15 each extend linearly in the first direction X. In this embodiment, the outer trench gate structures 15 are provided in the main junction region 45.

Emitter contacts 17 are defined in the FET structure region 9. The emitter contacts 17 connect the emitter electrode 5 (see FIG. 1) to emitter regions of FET structures provided in the FET structure region 9. The emitter contacts 17 are provided on the opposite sides of each of the trench gate structures 10.

The emitter contacts 17 each extend linearly along the trench gate structure 10. In this embodiment, the emitter contacts 17 are each divided at a middle portion thereof with respect to the second direction Y. More specifically, the emitter contacts 17 are each divided in an area near the intermediate connection trench structure 36, more specifically in an area associated with the isolation lead electrode layer 37. The isolation lead electrode layer 37 and the emitter contacts 17 are disposed in nonoverlapping relation as seen in the direction X.

Figure 3:
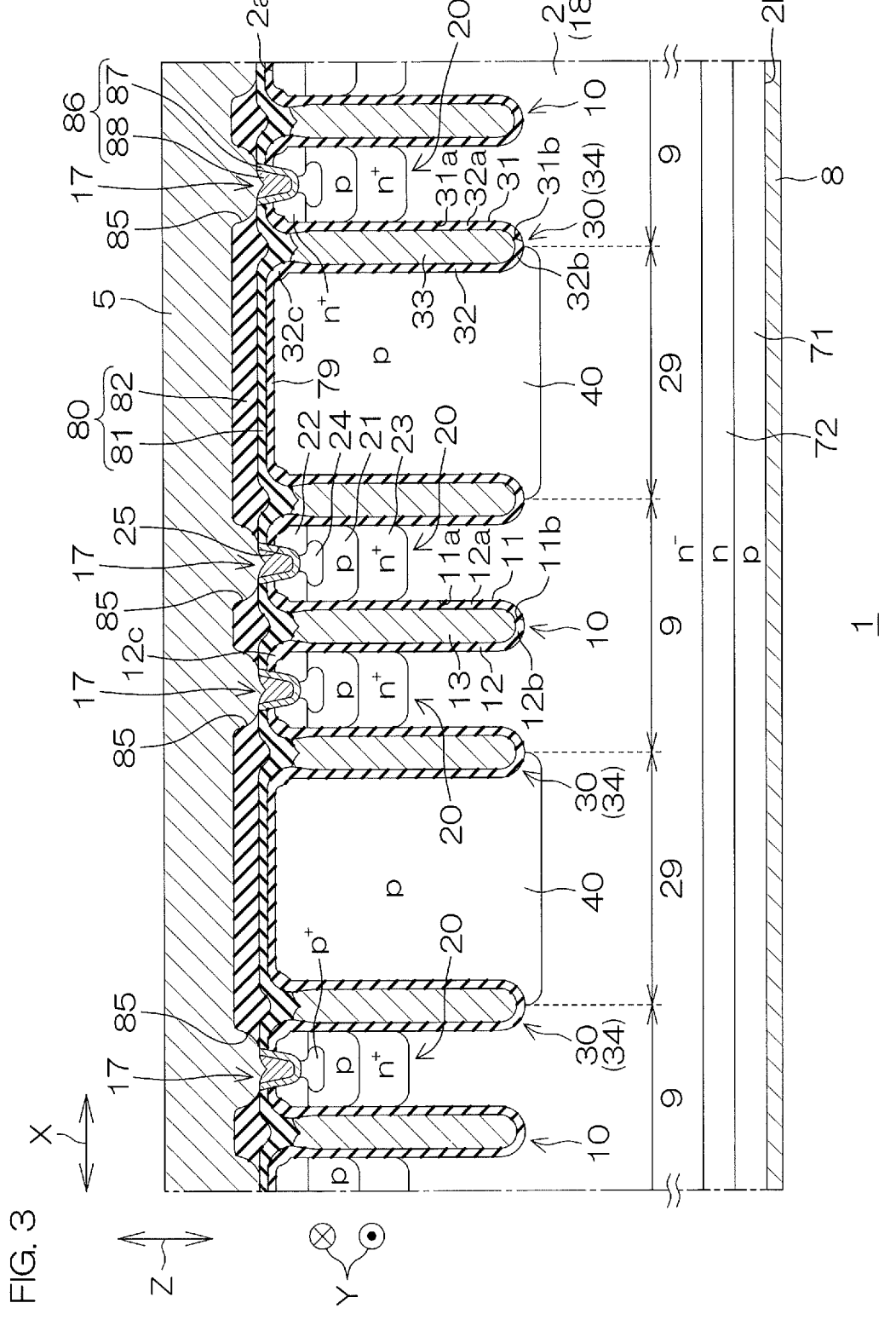
FIG. 3 is a sectional view taken along a sectional line III-III in FIG. 2, illustrating a sectional structure associated with a FET structure region and a floating region.

FIG. 3 is a sectional view taken along a sectional line in FIG. 2, illustrating a sectional structure associated with the FET structure region 9 and the floating region 40. The semiconductor layer 2 has a monocrystalline structure including an n-type semiconductor substrate 18. The semiconductor substrate 18 may be a silicon FZ substrate produced by a FZ (Floating Zone) method.

The semiconductor substrate 18 may have an n-type impurity concentration of not less than $4.0 \times 10^{13}$ cm$^{-3}$ and not greater than $2.0 \times 10^{14}$ cm$^{-3}$. The semiconductor substrate 18 may have a thickness of not less than 50 μm and not greater than 200 μm. The thickness of the semiconductor substrate 18 may be not less than 50 μm and not greater than 100 μm, not less than 100 μm and not greater than 150 μm, or not less than 150 μm and not greater than 200 μm.

A collector electrode 8 is provided on the second main surface 2b of the semiconductor layer 2. The collector electrode 8 is electrically connected to the second main surface 2b of the semiconductor layer 2. The collector electrode 8 forms an ohmic contact with the second main surface 2b of the semiconductor layer 2. The collector electrode 8 transmits a collector signal to the active region 3.

A p-type collector region 71 is provided in a surface layer of the second main surface 2b of the semiconductor layer 2. The collector region 71 may have a p-type impurity concentration of not less than $1.0 \times 10^{15}$ cm$^{-3}$ and not greater than $1.0 \times 10^{18}$ cm$^{-3}$. The collector region 71 forms an ohmic contact with the collector electrode 8. The collector region 71 may be provided in the entire surface layer of the second main surface 2b.

An n-type buffer layer 72 is provided on the collector region 71. The buffer layer 72 may be provided over the entire surface layer of the second main surface 2b of the semiconductor layer 2. The n-type impurity concentration of the buffer layer 72 is higher than the n-type impurity concentration of the semiconductor substrate 18.

The buffer layer 72 may have a thickness of not less than 0.5 μm and not greater than 5 μm, not less than 5 μm and not greater than 10 μm, not less than 10 μm and not greater than 15 μm, not less than μm and not greater than 20 μm, not less than 20 μm and not greater than 25 μm, or not less than 25 μm and not greater than 30 μm.

The floating regions 40 and the FET structure regions 9 are alternately arranged in the first direction X. The FET structure regions 9 are isolated from the floating regions 40 by the region isolation trench structures 30 (the main isolation trench structures 34). FET structures 20 each including the trench gate structure 10 are respectively provided in the FET structure regions 9. The trench gate structure 10 is provided in a middle portion of the FET structure region 9 with respect to the first direction X. More specifically, the trench gate structure 10 is provided in a position such that the FET structure region 9 is equally divided with respect to the first direction X.

The trench gate structure 10 includes a gate trench 11, a gate insulation layer 12, and a gate electrode layer 13. The gate trench 11 is provided in the first main surface 2a of the semiconductor layer 2. More specifically, the gate trench 11 extends to a predetermined depth in the semiconductor layer 2 from the first main surface 2a perpendicularly to the first main surface 2a (in the normal line direction Z).

The gate trench 11 includes a pair of side walls 11a and a bottom wall 11b connecting bottom edges of the side walls 11a. The side walls 11a of the gate trench 11 may each extend perpendicularly to the first main surface 2a of the semiconductor layer 2. Further, the side walls 11a of the gate trench 11 may each extend downward from the first main surface 2a of the semiconductor layer 2 to the bottom wall 11b obliquely with respect to the first main surface 2a. The gate trench 11 may be tapered so that its opening has an opening area greater than its bottom area. The bottom wall 11b of the gate trench 11 extends generally parallel to the first main surface 2a in the second direction Y. The bottom wall 11b of the gate trench 11 may be parallel to the first main surface 2a of the semiconductor layer 2. The bottom wall 11b of the gate trench 11 may have a concave shape recessed toward the second main surface 2b of the semiconductor layer 2.

The gate trench 11 includes an opening edge portion. The opening edge portion of the gate trench 11 connects the side walls 11a of the gate trench 11 to the first main surface 2a of the semiconductor layer 2. The opening edge portion of the gate trench has a tilt portion extending obliquely downward from the first main surface 2a of the semiconductor layer 2 to the side walls 11a of the gate trench 11. The opening edge portion of the gate trench 11 may have a concave shape recessed toward the second main surface 2b of the semiconductor layer 2. Thus, the gate trench 11 has a greater width portion provided around its opening as having a greater opening width than the width of the bottom wall 11b. The opening edge portion of the gate trench 11 may have a convex shape projecting toward the first main surface 2a of the semiconductor layer 2.

The gate trench 11 may have a depth of not less than 3.0 μm and not greater than 7.0 μm as measured perpendicularly to the first main surface 2a (in the normal line direction Z). The depth of the gate trench 11 may be not less than 3.0 μm and not greater than 4.0 μm, not less than 4.0 μm and not greater than 5.0 μm, not less than 5.0 μm and not greater than 6.0 μm, or not less than 6.0 μm and not greater than 7.0 μm.

The gate trench 11 may have a width of not less than 0.5 μm and not greater than 3.0 μm as measured perpendicularly to the length thereof. The width of the gate trench 11 is a width of the gate trench 11 as measured in the first direction X. The width of the gate trench 11 may be not less than 0.5 μm and not greater than 1.0 μm, not less than 1.0 μm and not greater than 1.5 μm, not less than 1.5 μm and not greater than 2.0 μm, not less than 2.0 μm and not greater than 2.5 μm, or not less than 2.5 μm and not greater than 3.0 μm.

The gate insulation layer 12 is provided in a film form on the inner wall of the gate trench 11. The gate insulation layer 12 defines a recessed space in the gate trench 11. In this embodiment, the gate insulation layer 12 includes a silicon oxide film. The gate insulation layer 12 may include a silicon nitride film instead of or in addition to the silicon oxide film.

The gate insulation layer 12 includes a first region 12a, a second region 12b, and a third region 12c. The first region 12a covers the side walls 11a of the gate trench 11. The second region 12b covers the bottom wall 11b of the gate trench 11. The third region 12c covers the opening edge portion of the gate trench 11.

The thickness of the second region 12b may be not less than the thickness of the first region 12a. The thickness of the second region 12b may be greater than the thickness of the first region 12a. The thickness of the third region 12c may be not less than the thickness of the first region 12a. The thickness of the third region 12c may be greater than the thickness of the first region 12a. Of course, the gate insulation layer 12 may have a uniform thickness.

The third region 12c includes a bulge which bulges into the gate trench 11 on the opening edge portion of the gate trench 11. The third region 12c projects into the gate trench 11 with its surface convexly curved. The third region 12c narrows the opening of the gate trench 11 around the opening edge portion of the gate trench 11.

The gate electrode layer 13 is buried in the gate trench 11 with the intervention of the gate insulation layer 12. More specifically, the gate electrode layer 13 is buried in the recessed space defined by the gate insulation layer 12 in the gate trench 11. The gate electrode layer 13 is controlled by a gate signal. That is, the gate electrode layer 13 is electrically connected to the gate electrode 6.

The gate electrode layer 13 is provided in a wall shape extending perpendicularly to the first main surface 2a of the semiconductor layer 2 (in the normal line direction Z) as viewed in section. The wall-shaped gate electrode layer 13 extends linearly in the second direction Y along the gate trench 11. The gate electrode layer 13 has an upper end portion located adjacent to the opening edge portion of the gate trench 11. The upper end portion of the gate electrode layer 13 is located on a side of the first main surface 2a of the semiconductor layer 2 closer to the bottom wall 11b of the gate trench 11.

The upper end portion of the gate electrode layer 13 has a recess which is recessed toward the bottom wall 11b of the gate trench 11. The recess of the upper end portion of the gate electrode layer 13 is tapered toward the bottom wall 11b of the gate trench 11. The upper end portion of the gate electrode layer 13 has a narrow portion which is narrowed along the third region 12c of the gate insulation layer 12.

The FET structures 20 each include p-type body regions 21 provided in the surface layer of the first main surface 2a of the semiconductor layer 2. The body regions 21 may each have a p-type impurity concentration of not less than $1.0 \times 10^{16}$ cm$^{-3}$ and not greater than $1.0 \times 10^{18}$ cm$^{-3}$.

The body regions 21 are provided on the opposite sides of the trench gate structure 10. The body regions 21 each have a band shape extending along the trench gate structure 10 as viewed in plan. The body regions 21 are exposed from the side walls 11a of the gate trench 11. Bottom portions of the body regions 21 are located at a depth position between the first main surface 2a of the semiconductor layer 2 and the bottom wall 11b of the gate trench 11 with respect to the direction perpendicular to the first main surface 2a (the normal line direction Z).

The FET structures 20 each include n$^+$-type emitter regions 22 provided in surface layers of the body regions 21. The emitter regions 22 may each have an n-type impurity concentration of not less than $1.0 \times 10^{19}$ cm$^{-3}$ and not greater than $1.0 \times 10^{21}$ cm$^{-3}$.

The emitter regions 22 are provided on the opposite sides of the trench gate structure 10. The emitter regions 22 each have a band shape extending along the trench gate structure 10 as viewed in plan. The emitter regions 22 are exposed from the first main surface 2a of the semiconductor layer 2. Further, the emitter regions 22 are exposed from the side walls 11a of the gate trench 11. Bottom portions of the emitter regions 22 are located at a depth position between the upper end portion of the gate electrode layer 13 and the bottom portions of the body regions 21 with respect to the direction perpendicular to the first main surface 2a (the normal line direction Z).

In this embodiment, the FET structures 20 each include $n^+$-type carrier storage regions 23 provided in a portion of the semiconductor layer 2 on a side of the body regions 21 closer to the second main surface 2b. The carrier storage regions 23 each have an n-type impurity concentration that is higher than the n-type impurity concentration of the semiconductor layer 2. The n-type impurity concentration of the carrier storage regions 23 may be not less than $1.0 \times 10^{15}$ $cm^{-3}$ and not greater than $1.0 \times 10^{17}$ $cm^{-3}$.

The carrier storage regions 23 are provided on the opposite sides of the trench gate structure 10. The carrier storage regions 23 each have a band shape extending along the trench gate structure 10 as viewed in plan. The carrier storage regions 23 are exposed from the side walls 11a of the gate trench 11. Bottom portions of the carrier storage regions 23 are located at a depth position between the bottom portions of the body regions 21 and the bottom wall 11b of the gate trench 11 with respect to the direction perpendicular to the first main surface 2a (the normal line direction Z).

The carrier storage regions 23 suppress the pullback (discharge) of holes (carrier) from the semiconductor layer 2 to the body regions 21. Thus, the holes are accumulated in regions of the semiconductor layer 2 immediately below the FET structure 20. As a result, the ON resistance and the ON voltage can be reduced.

In this embodiment, the FET structures 20 each further include emitter trenches 25 provided in the first main surface 2a of the semiconductor layer 2. The emitter trenches 25 are provided on the opposite sides of the trench gate structure 10.

The emitter trenches 25 are each spaced from the trench gate structure 10 in the first direction X. The emitter trenches 25 each have a band shape extending along the trench gate structure 10 as viewed in plan. The emitter trenches 25 each have a length that is not greater than the length of the trench gate structure 10 as measured in the second direction Y. More specifically, the length of the emitter trench 25 is less than the length of the trench gate structure 10. Still more specifically, the emitter trench 25 is provided in the emitter region 22. The emitter trench 25 may extend through the emitter region 22. The emitter region 22 is exposed from the inner wall of the emitter trench 25.

The FET structures 20 each include $p^+$-type contact regions 24 provided in portions of the body regions 21 along bottom walls of the emitter trenches 25. The contact regions 24 each have a p-type impurity concentration that is greater than the p-type impurity concentration of the body regions 21. The p-type impurity concentration of the contact regions 24 may be not less than $1.0 \times 10^{19}$ $cm^{-3}$ and not greater than $1.0 \times 10^{20}$ $cm^{-3}$.

The contact regions 24 each have a band shape extending along the emitter trench 25 as viewed in plan. The contact regions 24 are each exposed from the bottom wall of the emitter trench 25. Bottom portions of the contact regions 24 are located at a depth position between the bottom walls of the emitter trenches 25 and the bottom portions of the body regions 21 with respect to the normal line direction Z.

Thus, the gate electrode layer 13 is opposed to the body regions 21 and the emitter regions 22 across the gate insulation layer 12 in the FET structure 20. In this embodiment, the gate electrode layer 13 is also opposed to the carrier storage regions 23 across the gate insulation layer 12.

IGBT channels are formed in portions of the body regions 21 between the emitter regions 22 and the carrier storage regions 23. The ON/OFF of the channels are controlled by a gate signal.

Region isolation structures 29 for isolating the FET structure regions 9 from the other regions are provided in the first main surface 2a of the semiconductor layer 2. The region isolation structures 29 are each provided next to the FET structure 20 in the surface layer of the first main surface 2a of the semiconductor layer 2.

More specifically, the region isolation structures 29 are provided on opposite sides of each of the FET structure regions 9. The region isolation structures 29 are provided between the respective adjacent pairs of FET structure regions 9. Thus, the FET structure regions 9 are isolated from each other by the region isolation structures 29.

The region isolation structures 29 restrict the movement of holes injected in the semiconductor layer 2. That is, the holes bypass the region isolation structures 29 to flow into the FET structures 20. Thus, the holes are accumulated in the regions of the semiconductor layer 2 immediately below the FET structures 20, whereby the hole density is increased. As a result, the ON resistance and the ON voltage can be reduced.

The region isolation structures 29 respectively include the p-type floating regions 40, which are provided next to the FET structures 20 in the surface layer of the first main surface 2a of the semiconductor layer 2. The floating regions 40 are each provided in an electrically floating state.

Bottom portions of the floating regions 40 are located at a depth position between the bottom portions of the carrier storage regions 23 and the second main surface 2b with respect to the normal line direction Z. In this embodiment, the bottom portions of the floating regions 40 are located at a depth position between the bottom walls 11b of the gate trenches 11 and the second main surface 2b.

The p-type impurity concentration of the floating regions 40 may be not less than the p-type impurity concentration of the body regions 21. The p-type impurity concentration of the floating regions may be greater than the p-type impurity concentration of the body regions 21.

The p-type impurity concentration of the floating regions 40 may be not less than $1.0 \times 10^{16}$ $cm^{-3}$ and not greater than $1.0 \times 10^{20}$ $cm^{-3}$. The p-type impurity concentration of the floating regions 40 is preferably not less than $1.0 \times 10^{18}$ $cm^{-3}$ and not greater than $1.0 \times 10^{20}$ $cm^{-3}$.

The floating regions 40 each have a band shape extending along the FET structure 20 as viewed in plan. The length of the floating region 40 is smaller than the length of the gate trench 11 as measured in the second direction Y.

The region isolation structures 29 each include the region isolation trench structure 30 which isolates the floating region 40 from the FET structures 20. As viewed in plan, the region isolation trench structure 30 has a ring shape (in this embodiment, a rectangular ring shape) surrounding the floating region 40 (see FIG. 2).

The region isolation trench structure 30 includes a region isolation trench 31, a region isolation insulation layer 32, and a region isolation electrode layer 33.

The region isolation trench 31 is provided in the first main surface 2a of the semiconductor layer 2. The region isolation trench 31 includes side walls 31a and a bottom wall 31b. The side walls 31*a* of the region isolation trench 31 may be perpendicular to the first main surface 2*a* of the semiconductor layer 2. The side walls 31*a* of the region isolation trench 31 may extend downward from the first main surface 2*a* of the semiconductor layer toward the bottom wall 31*b* obliquely with respect to the first main surface 2*a*. The region isolation trench 31 may be tapered so that its opening edge portion has an opening area greater than its bottom area.

The emitter region 22, the body region 21 and the carrier storage region 23 are exposed from the side wall 31*a* of the region isolation trench 31 facing the FET structure 20. The floating region 40 is exposed from the side wall 31*a* of the region isolation trench 31 facing the floating region 40.

The bottom wall 31*b* of the region isolation trench 31 extends generally parallel to the first main surface 2*a* in the second direction Y. The bottom wall 31*b* of the region isolation trench 31 may be parallel to the first main surface 2*a* of the semiconductor layer 2. The bottom wall 31*b* of the region isolation trench 31 may have a concave shape recessed toward the second main surface 2*b* of the semiconductor layer 2. The bottom wall 31*b* of the region isolation trench 31 is covered with a bottom portion of the floating region 40. That is, the floating region 40 has a covering portion which covers the bottom wall 31*b* of the region isolation trench 31.

The region isolation trench 31 includes an opening edge portion. The opening edge portion of the region isolation trench 31 connects the side walls 31*a* of the region isolation trench 31 to the first main surface 2*a* of the semiconductor layer 2. The opening edge portion of the region isolation trench 31 has a tilt portion extending from the first main surface 2*a* of the semiconductor layer 2 toward the side walls 31*a* of the region isolation trench 31 obliquely with respect to the first main surface 2*a*. The opening edge portion of the region isolation trench 31 has a concave shape recessed toward the second main surface 2*b* of the semiconductor layer 2. Thus, the region isolation trench 31 has a greater width portion provided around its opening edge portion as having a greater opening width than the width of the bottom wall 31*b*. The opening edge portion of the region isolation trench 31 may have a convex shape projecting toward the first main surface 2*a* of the semiconductor layer 2.

The region isolation trench 31 may have a depth of not less than 3.0 μm and not greater than 7.0 μm as measured in the normal line direction Z. The depth of the region isolation trench 31 may be not less than 3.0 μm and not greater than 4.0 μm, not less than 4.0 μm and not greater than 5.0 μm, not less than 5.0 μm and not greater than 6.0 μm, or not less than 6.0 μm and not greater than 7.0 μm. The depth of the region isolation trench 31 may be equal to the depth of the gate trench 11.

The region isolation trench 31 may have a width of not less than 0.5 μm and not greater than 3.0 μm. The width of the region isolation trench 31 is a width of the region isolation trench 31 as measured perpendicularly to the extending direction of the region isolation trench 31 as viewed in plan, and a width of the region isolation trench 31 of the main isolation trench structure 34 as measured in the first direction X. The width of the region isolation trench 31 may be not less than 0.5 μm and not greater than 1.0 μm, not less than 1.0 μm and not greater than 1.5 μm, not less than 1.5 μm and not greater than 2.0 μm, not less than 2.0 μm and not greater than 2.5 μm, or not less than 2.5 μm and not greater than 3.0 μm. The width of the region isolation trench 31 may be equal to the width of the gate trench 11.

The region isolation insulation layer 32 is provided in a film form on the inner wall of the region isolation trench 31. The region isolation insulation layer 32 defines a recessed space in the region isolation trench 31. In this embodiment, the region isolation insulation layer 32 includes a silicon oxide film. The region isolation insulation layer 32 may include a silicon nitride film instead of or in addition to the silicon oxide film.

The region isolation insulation layer 32 includes a first region 32*a*, a second region 32*b*, and a third region 32*c*. The first region 32*a* covers the side walls 31*a* of the region isolation trench 31. The second region 32*b* covers the bottom wall 31*b* of the region isolation trench 31. The third region 32*c* covers the opening edge portion of the region isolation trench 31.

The thickness of the second region 32*b* may be not less than the thickness of the first region 32*a*. The thickness of the second region 32*b* may be greater than the thickness of the first region 32*a*. The thickness of the third region 32*c* may be not less than the thickness of the first region 32*a*. The thickness of the third region 32*c* may be greater than the thickness of the first region 32*a*.

The third region 32*c* includes a bulge which bulges into the region isolation trench 31 on the opening edge portion of the region isolation trench 31. The third region 32*c* projects into the region isolation trench 31 with its surface convexly curved. The third region 32*c* narrows the opening of the region isolation trench 31 around the opening edge portion of the region isolation trench 31. Of course, the isolation insulation layer 32 may have a uniform thickness.

The region isolation electrode layer 33 is buried in the region isolation trench 31 with the intervention of the region isolation insulation layer 32. More specifically, the region isolation electrode layer 33 is buried in the recessed space defined by the region isolation insulation layer 32 in the region isolation trench 31. The region isolation electrode layer 33 is controlled by an emitter signal. That is, the region isolation electrode layer 33 is electrically connected to the emitter electrode 5. The emitter signal is at a ground potential or a reference potential.

The region isolation electrode layer 33 is provided in a wall shape extending in the normal line direction Z of the first main surface 2*a* of the semiconductor layer 2 as viewed in section. The region isolation electrode layer 33 has an upper end portion located adjacent to the opening edge portion of the region isolation trench 31. The upper end portion of the region isolation electrode layer 33 is located on a side of the first main surface 2*a* of the semiconductor layer 2 closer to the bottom wall 31*b* of the region isolation trench 31.

The upper end portion of the region isolation electrode layer 33 has a recess which is recessed toward the bottom wall 31*b* of the region isolation trench 31. The recess of the upper end portion of the region isolation electrode layer 33 is tapered toward the bottom wall 31*b* of the region isolation trench 31. The upper end portion of the region isolation electrode layer 33 has a narrow portion which is narrowed along the third region 32*c* of the region isolation insulation layer 32.

A main surface insulation layer 79 is provided on the first main surface 2*a* of the semiconductor layer 2. The main surface insulation layer 79 is provided in a film form along the first main surface 2*a*. The main surface insulation layer 79 is continuous to the gate insulation layers 12 and the region isolation insulation layers 32. In this embodiment, the main surface insulation layer 79 includes a silicon oxide film. The main surface insulation layer 79 may include a silicon nitride film instead of or in addition to the silicon oxide film.

An interlevel insulation layer 80 is provided on the main surface insulation layer 79. The interlevel insulation layer 80 is provided in a film form along the first main surface 2a of the semiconductor layer 2. The interlevel insulation layer 80 may contain silicon oxide or silicon nitride. The interlevel insulation layer 80 may contain PSG (Phosphor Silicate Glass) and/or BPSG (Boron Phosphor Silicate Glass) as an example of the silicon oxide.

In this embodiment, the interlevel insulation layer 80 has a laminate structure including a first interlevel insulation layer 81 and a second interlevel insulation layer 82 stacked in this order from the first main surface 2a of the semiconductor layer 2. The first interlevel insulation layer 81 may contain PSG or BPSG. The second interlevel insulation layer 82 contains an insulative material different from that of the first interlevel insulation layer 81. The second interlevel insulation layer 82 may contain PSG or BPSG.

The interlevel insulation layer 80 is formed with emitter contact openings 85. The emitter trenches 25 are respectively exposed in the emitter contact openings 85. The emitter contact openings 85 respectively communicate with the emitter trenches 25. The emitter contact openings 85 each have an opening edge portion which has a concave shape recessed inward of the interlevel insulation layer 80. Thus, the emitter contacts 17 each have a greater opening width than the emitter trenches 25.

In this embodiment, the emitter trenches 25 are each provided in the first main surface 2a of the semiconductor layer 2 as extending through the first interlevel insulation layer 81 and the main surface insulation layer 79. Emitter plug electrode layers are respectively buried in the emitter trenches 25. The emitter plug electrode layers 86 are each electrically connected to the emitter region 22 and the contact region 24 in the emitter trench 25.

In this embodiment, the emitter plug electrode layers 86 each have a laminate structure including a barrier electrode layer 87 and a main electrode layer 88. The barrier electrode layer 87 is provided in a film form along the inner wall of the emitter trench 25. The barrier electrode layer 87 defines a recessed space in the emitter trench 25.

The barrier electrode layer 87 may have a single layer structure including a titanium layer or a titanium nitride layer. The barrier electrode layer 87 may have a laminate structure including a titanium layer and a titanium nitride layer. In this case, the titanium nitride layer may be laminated on the titanium layer.

The main electrode layer 88 is buried in the emitter trench 25 with the intervention of the barrier electrode layer 87. More specifically, the main electrode layer 88 is buried in the recessed space defined by the barrier electrode layer 87 in the emitter trench 25. The main electrode layer 88 may contain tungsten.

The emitter electrode 5 is provided on the interlevel insulation layer 80. The emitter electrode 5 may contain at least one selected from aluminum, copper, Al—Si—Cu (aluminum-silicon-copper) alloy, Al—Si (aluminum-silicon) alloy, and Al—Cu (aluminum-copper) alloy. The emitter electrode 5 may have a single layer structure containing one of these electrically conductive materials. The emitter electrode 5 may have a laminate structure formed by stacking at least two of these electrically conductive materials in a desired order.

The emitter electrode 5 intrudes into the emitter contact openings 85 from above the interlevel insulation layer 80 to form the emitter contacts 17. That is, the emitter electrode 5 is electrically connected to the emitter regions 22 and the contact regions 24 via the emitter contact openings 85. More specifically, the emitter electrode 5 is electrically connected to the emitter plug electrode layers 86 in the emitter contact openings 85. The emitter electrode 5 is electrically connected to the emitter regions 22 and the contact regions 24 via the emitter plug electrode layers 86.

The floating regions 40 are insulated from the emitter electrode 5 by the interlevel insulation layer 80. That is, the floating regions 40 are in an electrically floating state.

Figure 4:
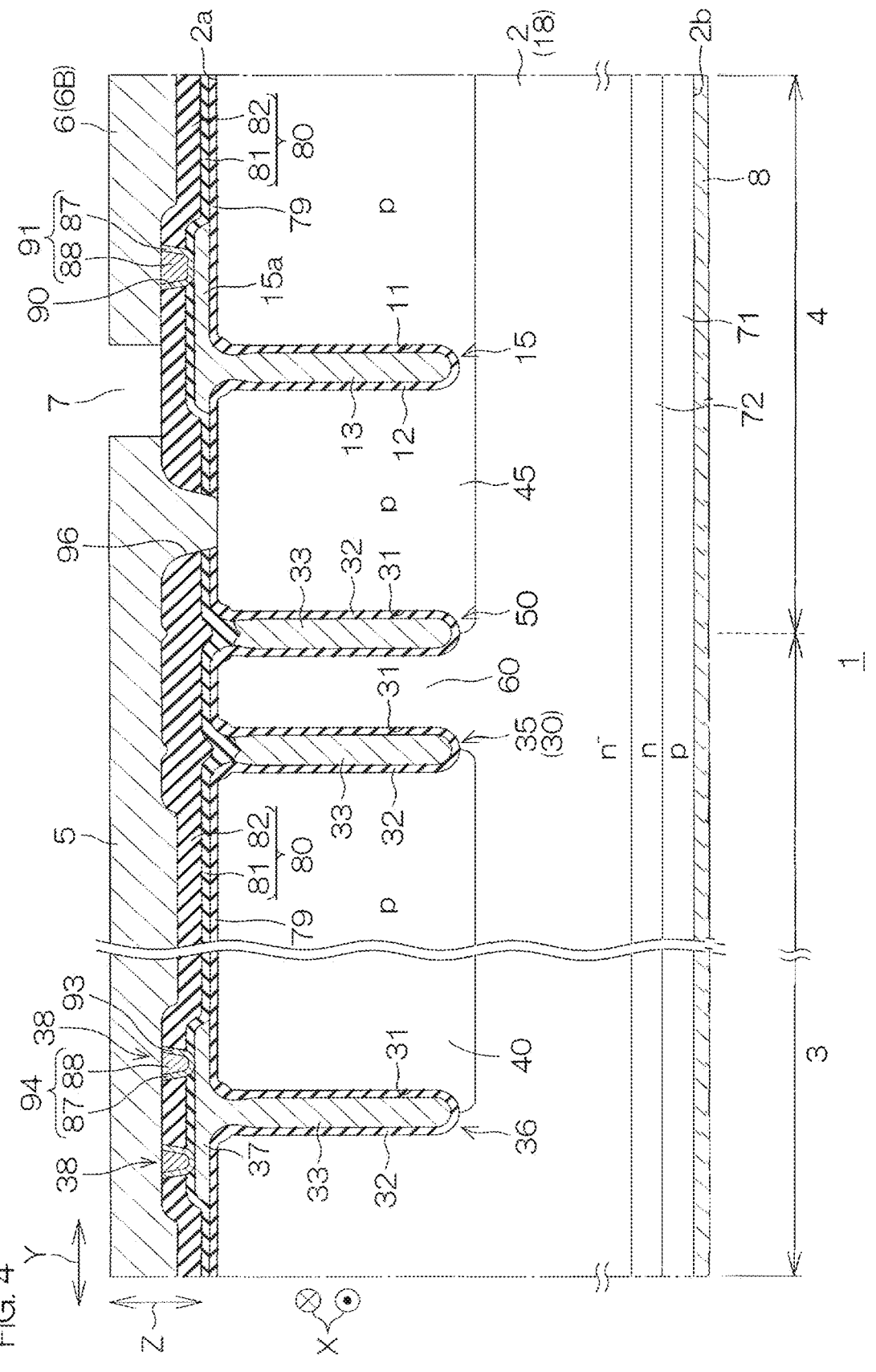
FIG. 4 is a sectional view taken along a line IV-IV in FIG. 2, illustrating a sectional structure around the boundary between the active region and the outer region.

FIG. 4 is a sectional view taken along a line IV-IV in FIG. 2, illustrating a sectional structure around the boundary between the active region 3 and the outer region 4. The floating regions 40 are each isolated from an outward region by the region isolation trench structure 30 (the end connection trench structure 35 in section in FIG. 4). Further, the outer isolation trench structure 50 is spaced outward from the region isolation trench structure in the second direction Y. The main junction region 45 is provided outward of the outer isolation trench structure 50. That is, the region isolation trench structure 30 (particularly, the end connection trench structure 35), the outer isolation trench structure 50, and the intervening region 60 which is a region of the semiconductor layer 2 defined between the region isolation trench structure 30 and the outer isolation trench structure 50 constitute a region separation structure 49. The region separation structure 49 separates the main junction region 45 from the floating region 40, and prevents the main junction region 45 and the floating region from being joined together or approaching each other.

The main junction region 45 may have the same p-type impurity concentration as the floating regions 40. In this case, the main junction region 45 and the floating regions may be formed in the same step. The p-type impurity concentration of the main junction region 45 may be not less than the p-type impurity concentration of the body regions 21. The p-type impurity concentration of the floating regions may be greater than the p-type impurity concentration of the body regions 21. The p-type impurity concentration of the main junction region 45 may be not less than $1.0 \times 10^{16}$ cm$^{-3}$ and not greater than $1.0 \times 10^{20}$ cm$^{-3}$. The p-type impurity concentration of the main junction region 45 is preferably not less than $1.0 \times 10^{18}$ cm$^{-3}$ and not greater than $1.0 \times 10^{20}$ cm$^{-3}$.

Since the outer isolation trench structure 50 has the same configuration as the region isolation trench structure 30, components of the outer isolation trench structure 50 corresponding to those of the region isolation trench structure 30 will be denoted by the same reference characters, and detailed description will be omitted. The outer isolation trench structure 50 includes an isolation trench 31 (outer isolation trench) provided in the first main surface 2a of the semiconductor layer 2, an isolation insulation layer 32 (outer isolation insulation layer) provided on the inner surface of the isolation trench 31, and an isolation electrode layer 33 (outer isolation electrode layer) buried in the isolation trench 31 with the intervention of the isolation insulation layer 32.

A bottom portion of the main junction region 45 is located at a depth position deeper than a bottom portion of the isolation trench 31 of the outer isolation trench structure 50. The bottom wall of the isolation trench 31 of the outer isolation trench structure 50 is covered with the bottom portion of the main junction region 45. That is, the main junction region 45 has a coverage portion which covers the bottom wall of the isolation trench 31 of the outer isolation trench structure 50.

The isolation trench 31 of the outer isolation trench structure 50 may have a depth of not less than 3.0 μm and not greater than 7.0 μm as measured in the normal line direction Z. The depth of the isolation trench 31 may be not less than 3.0 μm and not greater than 4.0 μm, not less than 4.0 μm and not greater than 5.0 μm, not less than 5.0 μm and not greater than 6.0 μm, or not less than 6.0 μm and not greater than 7.0 μm. The depth of the isolation trench 31 may be equal to the depth of the gate trench 11.

Further, the isolation trench 31 of the outer isolation trench structure 50 may have a width of not less than 0.5 μm and not greater than 3.0 μm. The width of the isolation trench 31 is a width as measured perpendicularly to the extending direction of the isolation trench 31 as viewed in plan, and a width of the isolation trench 31 of the outer isolation trench structure 50 as measured in the second direction Y. The width of the isolation trench 31 may be not less than 0.5 μm and not greater than 1.0 μm, not less than 1.0 μm and not greater than 1.5 μm, not less than 1.5 μm and not greater than 2.0 μm, not less than 2.0 μm and not greater than 2.5 μm, or not less than 2.5 μm and not greater than 3.0 μm. The width of the isolation trench 31 may be equal to the width of the gate trench 11.

A spacing between the region isolation trench structure 30 (the end connection trench structure 35 in section in FIG. 4) and the outer isolation trench structure 50 is greater than the width of the region isolation trench structure 30. Therefore, the width of the intervening region 60 as measured in the second direction Y is greater than the width of the region isolation trench structure 30. Further, the spacing between the region isolation trench structure 30 and the outer isolation trench structure 50 is greater than the width of the outer isolation trench structure 50. Therefore, the width of the intervening region 60 as measured in the second direction Y is greater than the width of the outer isolation trench structure 50.

The outer trench gate structures 15 are each spaced outward from the outer isolation trench structure 50 in the second direction Y. The outer trench gate structure 15 has the same configuration as the trench gate structure 10, except that the outer trench gate structure 15 extends in a different direction than the trench gate structure 10. Therefore, components of the outer trench gate structure 15 corresponding to those of the trench gate structure 10 will be denoted by the same reference characters, and duplicate description will be omitted.

In this embodiment, the outer trench gate structure 15 is disposed in the main junction region 45.

The gate electrode layer 13 of the outer trench gate structure 15 includes a gate lead electrode layer 15a extending from the gate trench 11 onto the first main surface 2a of the semiconductor layer 2. The gate lead electrode layer 15a extends from the gate trench 11 of the outer trench gate structure 15 onto the first main surface 2a of the semiconductor layer 2. The gate lead electrode layer 15a extends in the second direction Y.

The gate lead electrode layer 15a is electrically connected to the gate wiring 6B via a gate contact opening 90 provided in the interlevel insulation layer 80. A gate signal applied to the gate electrode 6 is transmitted to the gate electrode layer 13 via the gate wiring 6B and the gate lead electrode layer 15a. A gate plug electrode layer 91 is buried in the gate contact opening 90. Since the gate plug electrode layer 91 has the same structure as the emitter plug electrode layer 86, components of the gate plug electrode layer 91 corresponding to those of the emitter plug electrode layer 86 will be denoted by the same reference characters, and duplicate description will be omitted.

The intermediate connection trench structures are each disposed so as to divide the floating region 40 with respect to the second direction Y. Since the intermediate connection trench structure 36 has the same configuration as the region isolation trench structure 30, components of the intermediate connection trench structure 36 corresponding to those of the region isolation trench structure 30 will be denoted by the same reference characters, and duplicate description will be omitted.

The electrode layer 33 of the intermediate connection trench structure 36 includes the isolation lead electrode layer 37, which extends from the trench 31 onto the first main surface 2a of the semiconductor layer 2. The isolation lead electrode layer 37 extends from the trench 31 to opposite sides along the second direction Y. More specifically, the region isolation electrode layer 33 is made of polysilicon, and the isolation lead electrode layer 37 is formed of a polysilicon film unitarily with the electrode layer 33.

The isolation lead electrode layer 37 is electrically connected to the emitter electrode 5 via region isolation contact openings 93 provided in the interlevel insulation layer 80. An emitter signal applied to the isolation lead electrode layer 37 is transmitted to the region isolation electrode layer 33 via the isolation lead electrode layer 37. Region isolation plug electrode layers 94 are respectively buried in the region isolation contact openings 93. Since the region isolation plug electrode layers 94 each have the same structure as the emitter plug electrode layer 86, components of the region isolation plug electrode layers 94 corresponding to those of the emitter plug electrode layer 86 will be denoted by the same reference characters, and duplicate description will be omitted.

Main junction contact openings 96 are provided above the main junction region 45 as extending through the interlevel insulation layer 80 and the main surface insulation layer 79. The emitter electrode 5 intrudes into the main junction contact openings 96 to contact the main junction region 45. Therefore, the main junction region 45 is controlled at an emitter potential. Pt-type regions for ohmic contact with the emitter electrode may be provided in surface portions of the main junction region 45 exposed in the respective main junction contact openings 96. These pt-type regions can be formed in the same step as the contact regions 24.

As described above, the semiconductor device according to this embodiment includes the semiconductor layer 2 of the first conductivity type (n-type in this embodiment) having the first main surface 2a on one side thereof and the second main surface 2b on the other side thereof. The semiconductor device 1 includes the active region 3 defined in the surface layer of the first main surface 2a of the semiconductor layer 2. The semiconductor device 1 includes the outer region 4 defined outside the active region 3 in the surface layer of the first main surface 2a of the semiconductor layer 2. The main junction region 45 of the second conductivity type (p-type in this embodiment) is provided in the outer region 4 as surrounding the active region 3. The floating regions 40 of the second conductivity type (p-type in this embodiment) are provided in the electrically floating state in the active region 3. The semiconductor device 1 includes the region isolation trench structures 30 which respectively isolate the floating regions 40 in the surface layer of the first main surface 2a of the semiconductor layer 2. The semiconductor device 1 includes the outer isolation trench structures 50 spaced from the region isolation trench structures 30 to define the main junction region 45 outward thereof. The semiconductor device 1 includes the intervening regions 60 each disposed between the region isolation trench structure 30 and the outer isolation trench structure 50 to intervene between the main junction region 45 and the floating region 40.

Thus, the region isolation trench structure and the outer isolation trench structure 50 intervene between the main junction region 45 provided outside the active region 3 and the floating region 40. Further, the intervening region 60 intervenes between these trench structures. Thus, the main junction region 45 and the floating region can be reliably isolated from each other to be thereby prevented from being joined together and from undesirably approaching each other.

Therefore, the p-type main junction region 45 and the p-type floating region 40 can be properly spaced from each other, thereby preventing formation of a parasitic pnp transistor therebetween. As a result, it is possible to eliminate drawbacks such as oscillation at around a threshold in collector current characteristic with respect to gate voltage. Thus, the semiconductor device 1 is capable of operating stably.

In this embodiment, the width of the intervening region 60 from the region isolation trench structure 30 to the outer isolation trench structure 50 is greater than the width of the region isolation trench structure 30. With this arrangement, the width of the intervening region 60 is great enough to provide a sufficient spacing between the floating region 40 and the main junction region 45. Thus, the semiconductor device 1 is capable of operating stably.

Further, the semiconductor device 1 of this embodiment includes a linkage trench structure (the main isolation trench structure extension portions 34A) which continuously connects the region isolation trench structure 30 to the outer isolation trench structure 50. This arrangement makes it possible to maintain the region isolation trench structure 30 and the outer isolation trench structure 50 at the same potential. More specifically, the region isolation electrode layers 33 of the region isolation trench structure 30 and the outer isolation trench structure 50 are continuous to each other to be maintained at the same potential. Thus, the floating region 40 and the main junction region 45 can be reliably isolated from each other. That is, the electric field in the intervening region 60 can be mitigated, thereby suppressing the movement of the carrier between the floating region 40 and the main junction region 45.

The semiconductor device 1 of this embodiment includes an electrode (the emitter electrode 5) to which the region isolation trench structures 30 and the outer isolation trench structures 50 are commonly connected.

In this embodiment, more specifically, the region isolation electrode layers 33 of the region isolation trench structures 30 are respectively continuous to the region isolation electrode layers of the outer isolation trench structures 50. These region isolation electrode layers 33 are electrically connected to the emitter electrode 5. Therefore, the region isolation electrode layers 33 of the region isolation trench structures 30 and the outer isolation trench structures 50 are controlled at the same potential as the emitter electrode 5 (the ground potential or the reference potential). Thus, the isolation between the floating regions 40 and the main junction region 45 can be more reliably achieved, contributing to the stable operation of the semiconductor device 1.

In this embodiment, the second conductivity type impurity concentration of the intervening regions 60 is equal to the second conductivity type impurity concentration of the semiconductor layer 2. More specifically, the intervening regions 60 are not provided with any p-type region which may otherwise electrically connect the floating regions 40 to the main junction region 45. Thus, the movement of the carrier between the floating regions 40 and the main junction region 45 can be suppressed.

In this embodiment, the region isolation trench structures 30 each include the region isolation trench 31 provided in the first main surface 2a of the semiconductor layer 2. The region isolation trench structures 30 each include the region isolation insulation layer 32 provided on the inner surface of the region isolation trench 31. The region isolation trench structures 30 each include the region isolation electrode layer 33 buried in the region isolation trench 31 with the intervention of the region isolation insulation layer 32. With this arrangement, the electric field in the active region can be controlled by controlling the potential of the region isolation electrode layers 33, and the region isolation structures 29 can be provided in the active region 3.

In this embodiment, the outer isolation trench structures 50 each include the isolation trench 31 (outer isolation trench) provided in the first main surface 2a of the semiconductor layer 2. The outer isolation trench structures 50 each include the isolation insulation layer 32 (outer isolation insulation layer) provided on the inner surface of the isolation trench 31. The outer isolation trench structures 50 each include the isolation electrode layer 33 (outer isolation electrode layer) buried in the isolation trench 31 with the intervention of the isolation insulation layer 32. With this arrangement, the electric field in the outer region 4 can be controlled by controlling the potential of the isolation electrode layers 33. Thus, the outer region 4 can have a proper terminal structure.

Where the region isolation trench structures 30 and the outer isolation trench structures 50 have the same configuration, these structures can be formed in the same step.

In this embodiment, the region isolation trench structures 30 define the FET structure regions therebetween on the sides opposite from the floating regions 40. With this arrangement, the FET structure regions 9 can be defined in the active region 3. More specifically, the FET structure regions 9 are defined by the region isolation structures 29 each including the floating region 40 and the region isolation trench structure 30. The region isolation structures 29 restrict the movement of the holes injected into the semiconductor layer 2. That is, the holes bypass the region isolation structures 29 to flow into the FET structure regions 9. Thus, the holes are accumulated immediately below the FET structures 20, so that the hole density is increased. As a result, the ON resistance and the ON voltage can be reduced.

In this embodiment, the isolation trench contacts 38 for connecting the region isolation electrode layers 33 of the region isolation trench structures 30 and the outer isolation trench structures 50 to the emitter electrode 5 are disposed in the floating regions 40 as viewed in plan. Thus, the region isolation trench structures 30 and the outer isolation trench structures 50 can be connected to the emitter electrode 5 without increasing the number of regions in which the holes are movable. This increases the hole density in the FET structure regions 9.

In this embodiment, the trench gate structures 10 are respectively provided in the FET structure regions 9 in the first main surface 2a of the semiconductor layer 2. With this arrangement, the FET structures 20 of trench gate type are provided.

The trench gate structures 10 each include the gate trench 11 provided in the first main surface 2a of the semiconductor layer 2. The trench gate structures 10 each include the gate insulation layer 12 provided on the inner surface of the gate trench 11. The trench gate structures 10 each include the gate electrode layer 13 buried in the gate trench 11 with the intervention of the gate insulation layer 12. Where the trench gate structures 10 and the region isolation trench structures 30 have the same configuration, these structures can be formed in the same step. Where the trench gate structures 10, the region isolation trench structures 30 and the outer isolation trench structures 50 have the same configuration, these structures can be formed in the same step.

The semiconductor device 1 of this embodiment includes the collector region 71 of the second conductivity type provided in the surface layer of the second main surface 2b. Thus, the semiconductor device 1 can include the IGBT.

In this embodiment, the floating regions 40 each have the bottom portion at the depth position deeper than the region isolation trench structures 30 as measured from the first main surface 2a. This arrangement more efficiently increases the hole density in the FET structure regions 9.

Where the floating regions 40 each extend to the depth position deeper than the region isolation trench structures 30, the isolation between the floating regions 40 and the main junction region 45 is more important. The outer isolation trench structures 50, together with the intervening regions provided between the outer isolation trench structures 50 and the region isolation trench structures 30, reliably prevent the floating regions 40 and the main junction region 45 from being joined together or approaching each other. Thus, the semiconductor device 1 is capable of operating stably.

In this embodiment, the main junction region 45 has the bottom portion at the depth position deeper than the outer isolation trench structures 50 from the first main surface 2a. Thus, the outer region 4 can have a proper terminal structure.

The depth of the main junction region 45 may be substantially the same as the depth of the floating regions 40. For example, the main junction region 45 and the floating regions 40 may be formed in the same step. Further, the region isolation trench structures 30 and the outer isolation trench structures 50 may be formed in the same step. In this case, where the bottom portions of the floating regions 40 are to be located at a depth position deeper than the region isolation trench structures 30, the bottom portion of the main junction region is located at a depth position deeper than the outer isolation trench structures 50. Even in this case, the region isolation trench structures 30, the intervening regions 60 and the outer isolation trench structures 50 intervene between the floating regions 40 and the main junction region 45, so that sufficient spacings can be provided between the floating regions 40 and the main junction region 45. Therefore, the semiconductor device 1 is capable of operating stably.

Figure 5:
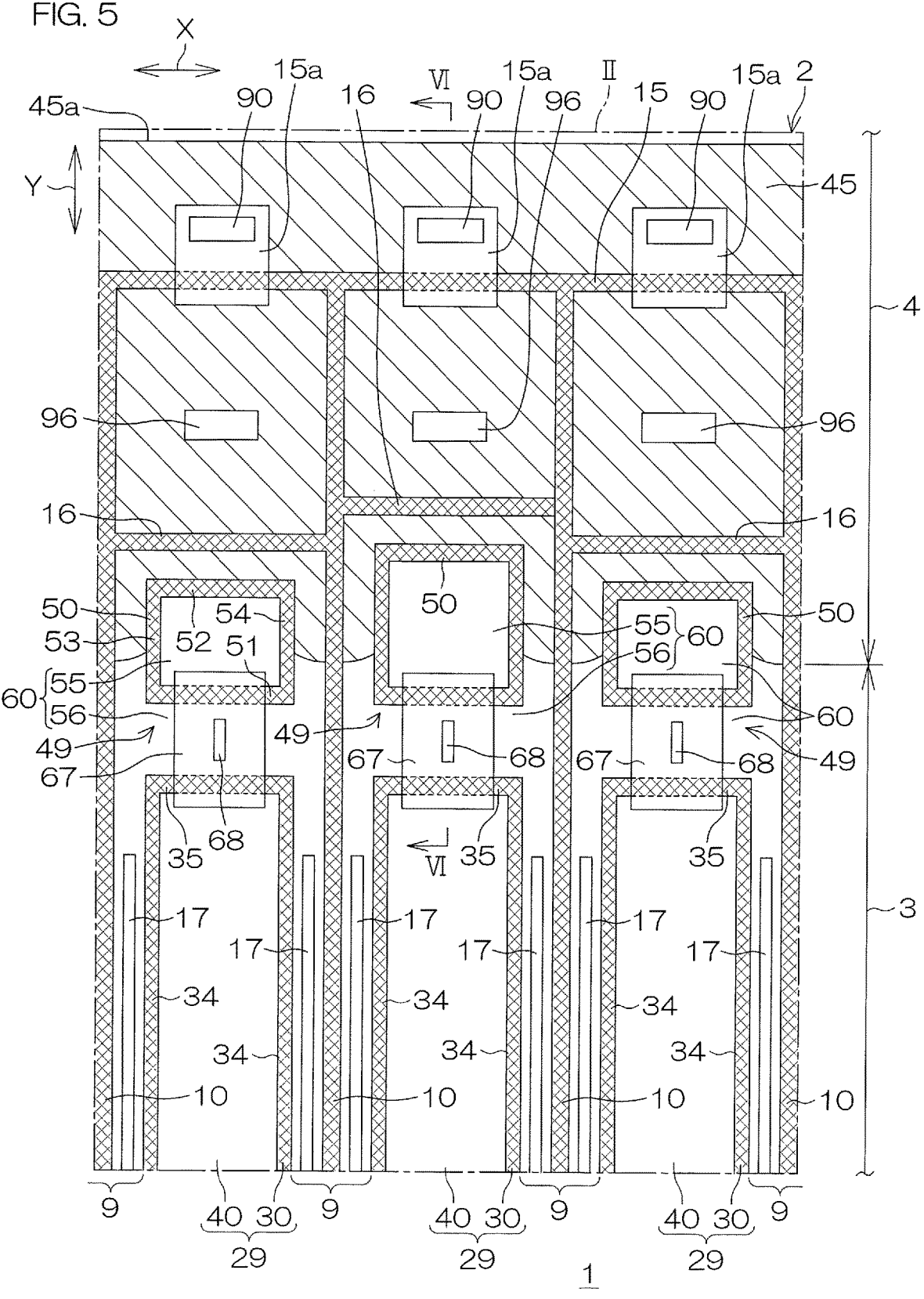
FIG. 5 is an enlarged partial plan view for describing the construction of a semiconductor device according to a second embodiment of the present invention.

FIG. 5 is an enlarged partial plan view for describing the construction of a semiconductor device according to a second embodiment of the present invention, illustrating a portion of the semiconductor device 1 corresponding to that shown above in FIG. 2. In FIG. 5, components corresponding to those shown in FIG. 2 will be denoted by the same reference characters, and duplicate description will be omitted.

In this embodiment, a first outer isolation trench structure 51 and a second outer isolation trench structure 52 are provided as being spaced outward from the region isolation trench structure 30 (particularly, the end connection trench structure 35) in the second direction Y.

The first outer isolation trench structure 51 extends linearly in the first direction X as viewed in plan. That is, the first outer isolation trench structure 51 extends parallel to the end connection trench structure 35 as viewed in plan. The second outer isolation trench structure 52 is spaced from the first outer isolation trench structure 51 in the second direction Y. The second outer isolation trench structure 52 extends linearly in the first direction X as viewed in plan. That is, the second outer isolation trench structure 52 is parallel to the end connection trench structure 35 as viewed in plan. Further, the second outer isolation trench structure 52 is parallel to the first outer isolation trench structure 51 as viewed in plan.

Opposite ends of the first outer isolation trench structure 51 are located at substantially the same positions as opposite ends of the second outer isolation trench structure 52 with respect to the first direction X. One of the opposite ends of the first outer isolation trench structure 51 is connected to one of the opposite ends of the second outer isolation trench structure 52 by a first outer linkage trench structure 53. The other end of the first outer isolation trench structure 51 is connected to the other end of the second outer isolation trench structure 52 by a second outer linkage trench structure 54. The first outer linkage trench structure 53 extends linearly in the second direction Y. The second outer linkage trench structure 54 extends linearly in the second direction Y. Therefore, the first outer linkage trench structure 53 and the second outer linkage trench structure 54 are parallel to each other.

The first and second outer isolation trench structures 51, 52 and the first and second outer linkage trench structures 53, 54 form a ring-shaped outer isolation trench structure 50 of closed loop (in this embodiment, quadrilateral loop (more specifically, rectangular loop)) as viewed in plan, whereby a semiconductor region 55 isolated from its periphery is provided. That is, the intervening region 60 includes this semiconductor region 55. The intervening region 60 further includes a semiconductor region 56 defined between the outer isolation trench structure 50 and the region isolation trench structure 30.

An isolation lead electrode layer 67 spans between the end connection trench structure 35 and the first outer isolation trench structure 51. The isolation lead electrode layer 67 is formed of, for example, a polysilicon film. An isolation trench contact 68 for connection to the emitter electrode 5 is provided in a region between the end connection trench structure 35 and the first outer isolation trench structure 51 on the isolation lead electrode layer 67.

The outer trench gate structure 15 is spaced outward from the second outer isolation trench structure 52 in the second direction Y.

The main junction region 45 (shown by hatch) contacts the ring-shaped outer isolation trench structure 50 from outside the semiconductor region 55. That is, the main junction region 45 contacts the second outer isolation trench structure 52 from outside with respect to the second direction Y. The main junction region 45 contacts the first and second outer linkage trench structures 53, 54 from outside with respect to the first direction X. The main junction region 45 does not contact the first outer isolation trench structure 51. In this embodiment, the main junction region 45 contacts the entire length of the second outer isolation trench structure 52. The main junction region 45 contacts a part of the first outer linkage trench structure 53. More specifically, the main junction region 45 contacts a part of the first outer linkage trench structure 53 extending from an end thereof adjacent to the second outer isolation trench structure 52 to a middle portion thereof, but does not contact a part of the first outer linkage trench structure 53 extending from the middle portion thereof to an end thereof adjacent to the first outer isolation trench structure 51. The main junction region 45 contacts a part of the second outer linkage trench structure 54. More specifically, the main junction region 45 contacts a part of the second outer linkage trench structure 54 extending from an end thereof adjacent to the second outer isolation trench structure 52 to a middle portion thereof, but does not contact a part of the second outer linkage trench structure 54 extending from the middle portion thereof to an end thereof adjacent to the first outer isolation trench structure 51.

The main junction region 45 has edge portions extending generally linearly between respective adjacent pairs of outer isolation trench structures 50. The edge portions each extend, for example, in the first direction X. The edge portions are each located outward of the first outer isolation trench structure 51 with respect to the second direction Y. The edge portions of the main junction region 45 may each have a convex shape projecting into the active region 3.

In this embodiment, the outer edge 45a of the main junction region 45 is located outward of the outer trench gate structure 15. In other words, the outer trench gate structure 15 is located in the main junction region 45.

In this embodiment, connection trench gate structures 16 are provided in the main junction region 45 so as to connect the respective adjacent pairs of trench gate structures 10. The connection trench gate structures 16 each extend linearly. More specifically, the connection trench gate structures 16 each extend linearly perpendicularly to the trench gate structures 10 (in the first direction X). Connection positions at which the connection trench gate structures 16 are connected to opposite end portions of the corresponding trench gate structures with respect to the second direction Y are staggered in the first direction X. Thus, T-connections between the trench gate structures 10 and established, thereby eliminating cross-connections. Thus, local line width increase can be prevented, which may otherwise occur due to the cross-connections. According to the positions of the connection trench gate structures 16, the ring-shaped outer isolation trench structures 50 as viewed in plan have different lengths as measured in the second direction Y. In the first embodiment described above, the same arrangement of the connection trench gate structures 16 may be employed.

Figure 6:
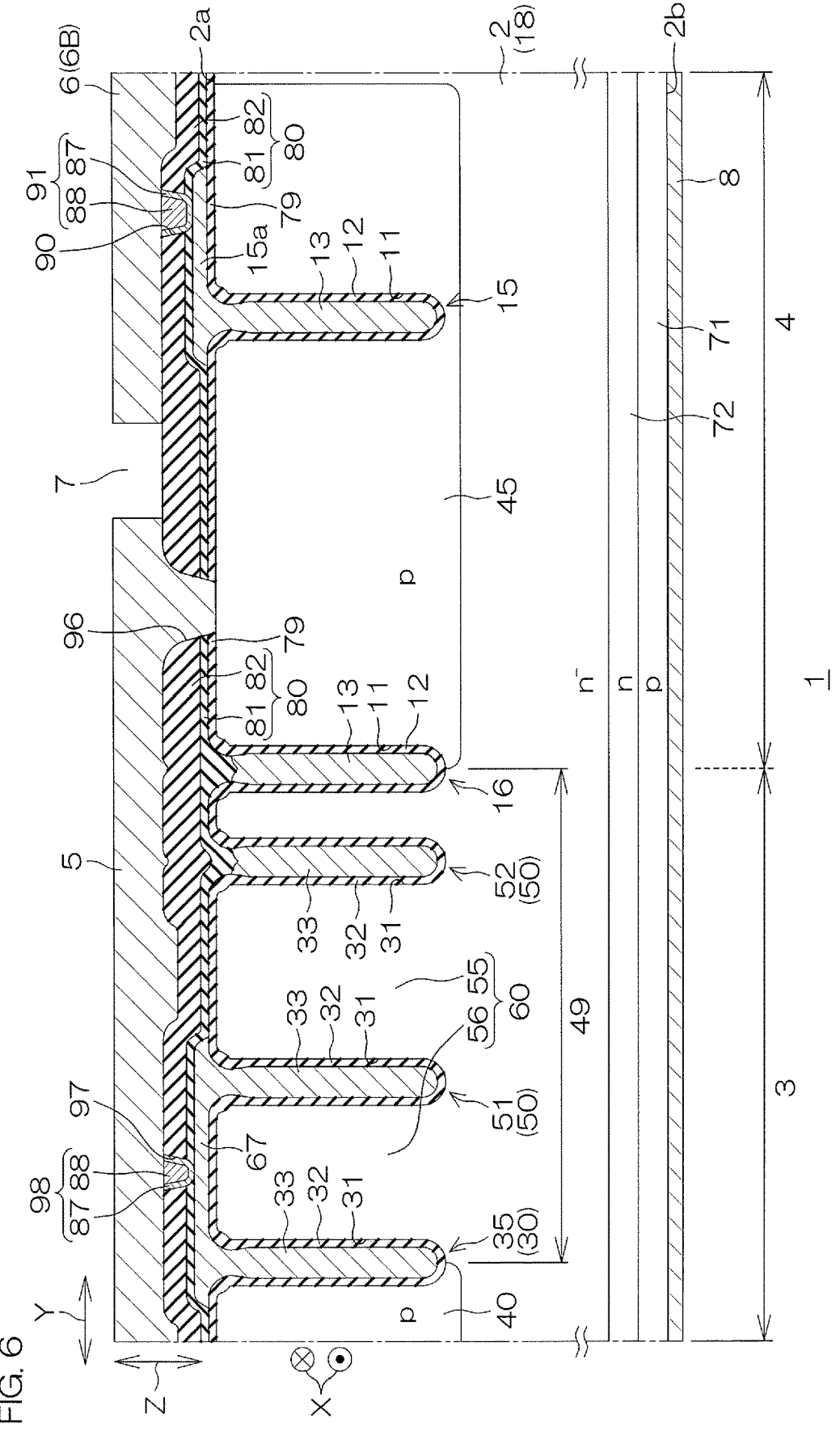
FIG. 6 is a sectional view for describing an isolation structure between a floating region and a main junction region, illustrating a sectional structure taken along a line VI-VI in FIG. 5.

FIG. 6 is a sectional view for describing an isolation structure between the p-type floating region 40 and the p-type main junction region 45, illustrating a sectional structure taken along a line VI-VI in FIG. 5.

The p-type floating region 40 is isolated from an outward region by the region isolation trench structure 30 (the end connection trench structure 35 in section in FIG. 6). Further, the first outer isolation trench structure 51 is spaced outward from the end connection trench structure 35 in the second direction Y. Furthermore, the second outer isolation trench structure 52 is spaced outward from the first outer isolation trench structure 51 in the second direction Y. The main junction region 45 is provided outward of the second outer isolation trench structure 52.

That is, the end connection trench structure 35, the first outer isolation trench structure 51, the second outer isolation trench structure 52, and the intervening region 60 extending from the end connection trench structure 35 to the second outer isolation trench structure 52 constitute the region separation structure 49. The region separation structure 49 separates the floating region 40 from the main junction region 45 to prevent the floating region 40 and the main junction region 45 from being joined together or approaching each other.

Since the first and second outer isolation trench structures 51, 52 each have the same configuration as the region isolation trench structure 30, components of the first and second outer isolation trench structures 51, 52 corresponding to those of the region isolation trench structure 30 will be denoted by the same reference characters, and duplicate description will be omitted. The first and second outer linkage trench structures 53, 54 also each have the same configuration as the region isolation trench structure 30.

The isolation electrode layers 33 of the end connection trench structure 35 and the first outer isolation trench structure 51 have the isolation lead electrode layer 67 extending from the isolation trenches 31 onto the first main surface 2a of the semiconductor layer 2. The isolation lead electrode layer 67 extends in a region between the end connection trench structure 35 and the first outer isolation trench structure 51 in the second direction Y. More specifically, the isolation electrode layers are made of polysilicon, and the isolation lead electrode layer 67 is formed of a polysilicon film unitarily with the isolation electrode layers 33 of the end connection trench structure 35 and the first outer isolation trench structure 51.

The isolation lead electrode layer 67 is electrically connected to the emitter electrode 5 via a region isolation contact opening 97 provided in the interlevel insulation layer 80. A region isolation plug electrode layer 98 is buried in the region isolation contact opening 97. Since the region isolation plug electrode layer 98 has the same structure as the emitter plug electrode layer 86, components of the region isolation plug electrode layer 98 corresponding to those of the emitter plug electrode layer 86 will be denoted by the same reference characters, and duplicate description will be omitted. An emitter signal applied to the isolation lead electrode layer 67 is transmitted to the region isolation electrode layers 33 via the region isolation plug electrode layer 98 and the isolation lead electrode layer 67.

The connection trench gate structures 16 are each disposed as being spaced further outward from the second outer isolation trench structure 52 in the second direction Y. Since the connection trench gate structures 16 each have the same configuration as the trench gate structure 10, components of the connection trench gate structure 16 corresponding to those of the trench gate structure 10 will be denoted by the same reference characters, and duplicate description will be omitted.

In this embodiment, as described above, the connection trench gate structures 16 are disposed in the main junction region 45.

The outer trench gate structures 15 are each spaced outward from the connection trench gate structures 16 in the second direction Y. In this embodiment, as described above, the outer trench gate structures 15 are disposed in the main junction region 45. Since the outer trench gate structures 15 and connection structures to the gate electrode 6 are the same as in the first embodiment (see FIG. 4), duplicate description will be omitted.

In this embodiment, the two semiconductor regions 55, 56 of the intervening region 60 are provided with no p-type region, and each have the same impurity concentration as the semiconductor layer 2.

In this embodiment, the same effects as in the first embodiment can be provided, so that the semiconductor device 1 is capable of operating stably.

In this embodiment, the region isolation trench structure 30 is separated from the outer isolation trench structure 50. This makes it easier to provide a spacing between the region isolation trench structure 30 and the outer isolation trench structure 50, and makes it correspondingly easier to provide a spacing between the floating region 40 and the main junction region 45.

In this embodiment, the outer isolation trench structure 50 includes the first outer isolation trench structure 51 spaced from the region isolation trench structure 30. The outer isolation trench structure 50 includes the second outer isolation trench structure 52 disposed in spaced relation from the first outer isolation trench structure 51 to define the main junction region 45 outward thereof. The intervening region 60 includes the semiconductor region 55 provided between the first outer isolation trench structure 51 and the second outer isolation trench structure 52.

With this arrangement, the region isolation trench structure 30, the first and second outer isolation trench structures 51, 52, and the intervening region 60 intervene between the floating region 40 and the main junction region 45. Thus, a sufficient spacing is provided between the floating region 40 and the main junction region 45. This prevents the deterioration in operation characteristics which may otherwise occur due to the movement of the carrier between the floating region and the main junction region 45. Thus, the semiconductor device 1 is capable of operating stably.

In this embodiment, the outer isolation trench structure 50 further includes the outer linkage trench structures 53, 54 connecting the first outer isolation trench structure 51 to the second outer isolation trench structure 52, and have a ring shape as viewed in plan perpendicularly to the first main surface 2a.

With this arrangement, a spacing can be provided between the floating region 40 and the main junction region 45 by the semiconductor region 55 defined in the ring-shaped outer isolation trench structure 50. This more efficiently suppresses the movement of the carrier between the floating region 40 and the main junction region 45, contributing to the stable operation of the semiconductor device 1.

Figure 7:
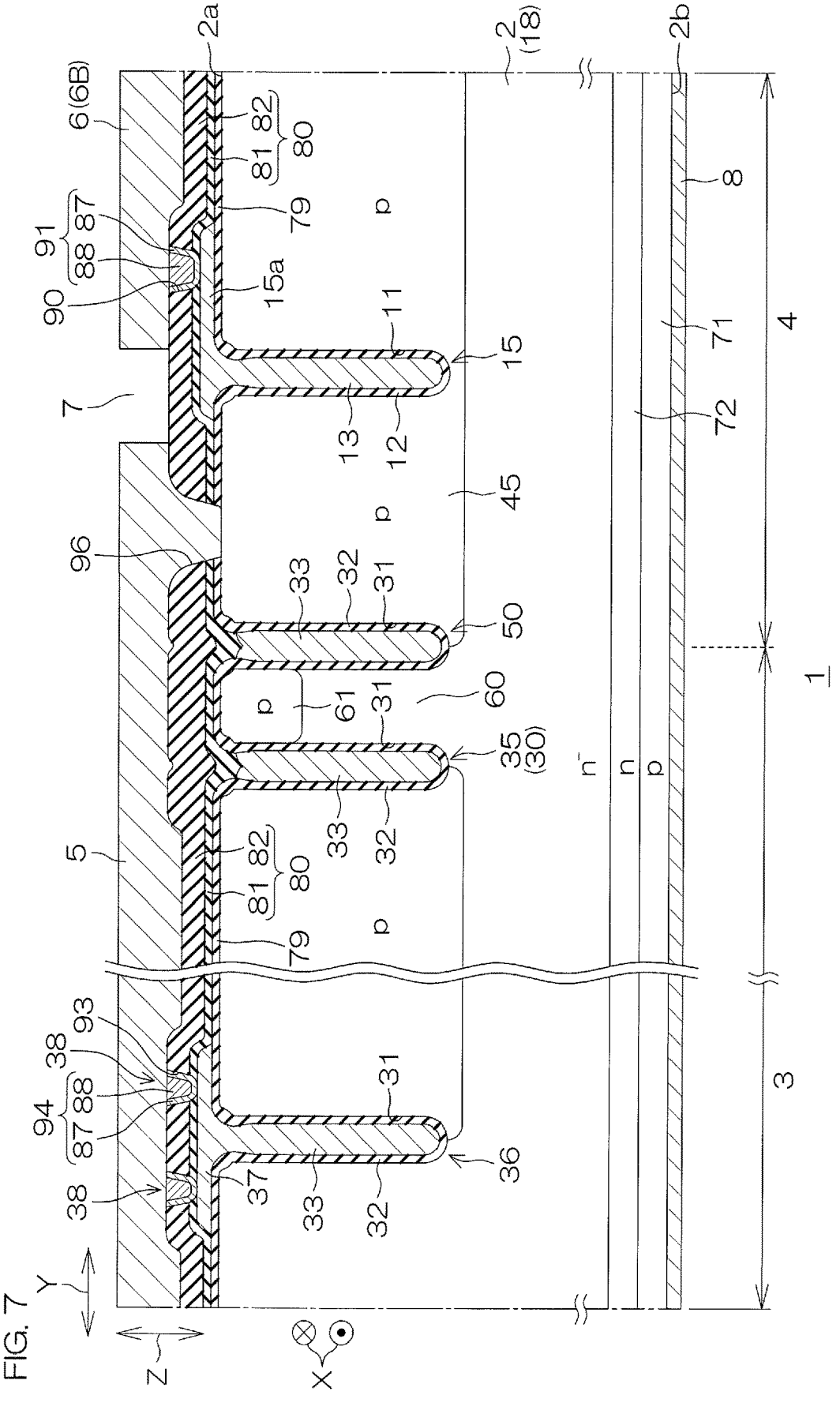
FIG. 7 is a sectional view for describing the construction of a semiconductor device according to a third embodiment of the present invention.
Figure 8:
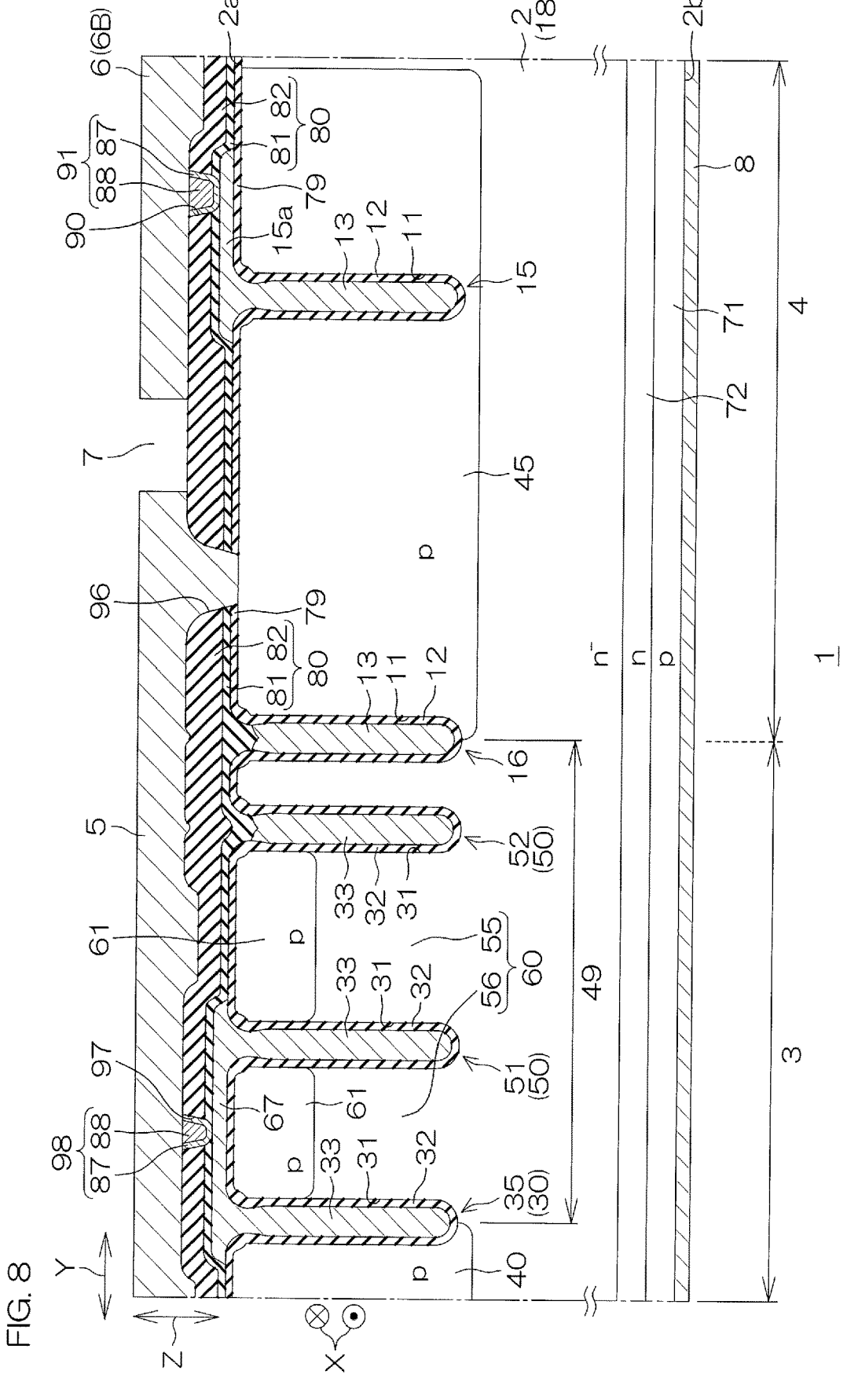
FIG. 8 is a sectional view for describing the construction of a semiconductor device according to a fourth embodiment of the present invention.

FIG. 7 is a sectional view for describing the construction of a semiconductor device 1 according to a third embodiment of the present invention, illustrating a sectional structure corresponding to that shown above in FIG. 4. That is, the third embodiment is a modification of the first embodiment. FIG. 8 is a sectional view for describing the construction of a semiconductor device 1 according to a fourth embodiment of the present invention, illustrating a sectional structure corresponding to that shown in FIG. 6. That is, the fourth embodiment is a modification of the second embodiment.

In these embodiments, the intervening regions each include a well region 61 having a higher second conductivity type impurity concentration (in these embodiments, a higher p-type impurity concentration) than the semiconductor layer 2. The well region 61 suppresses an electric field applied to the main surface insulation layer 79, thereby contributing to the stable operation of the semiconductor device 1. That is, the breakdown of a portion of the insulation layer (the main surface insulation layer 79) present on the surface of the intervening region 60 (the first main surface 2a) can be suppressed.

The p-type well region 61 is exposed in the first main surface 2a, and extends to a predetermined depth from the first main surface 2a. In this embodiment, the bottom portion of the well region 61 is located at a shallower depth position than the bottom portion of the region isolation trench structure 30. In this embodiment, the bottom portion of the well region 61 is located at a shallower depth position than the bottom portion of the outer isolation trench structure 50. Further, the bottom portion of the well region 61 is located at a shallower depth position than the bottom portion of the floating region 40. Furthermore, the bottom portion of the well region 61 is located at a shallower depth position than the bottom portion of the main junction region 45.

The depth position of the bottom portion of the well region 61 may be generally equal to the depth position of the bottom portion of the body region 21. In this case, the well region 61 can be formed by diffusing the p-type impurity into the intervening region 60 in an impurity diffusing step of forming the p-type body region 21.

The p-type impurity concentration of the well region 61 may be equal to the p-type impurity concentration of the body region 21. The p-type impurity concentration of the well region 61 may be not less than $1.0 \times 10^{17}$ cm$^{-3}$ and not greater than $1.0 \times 10^{18}$ cm$^{-3}$.

Figure 9:
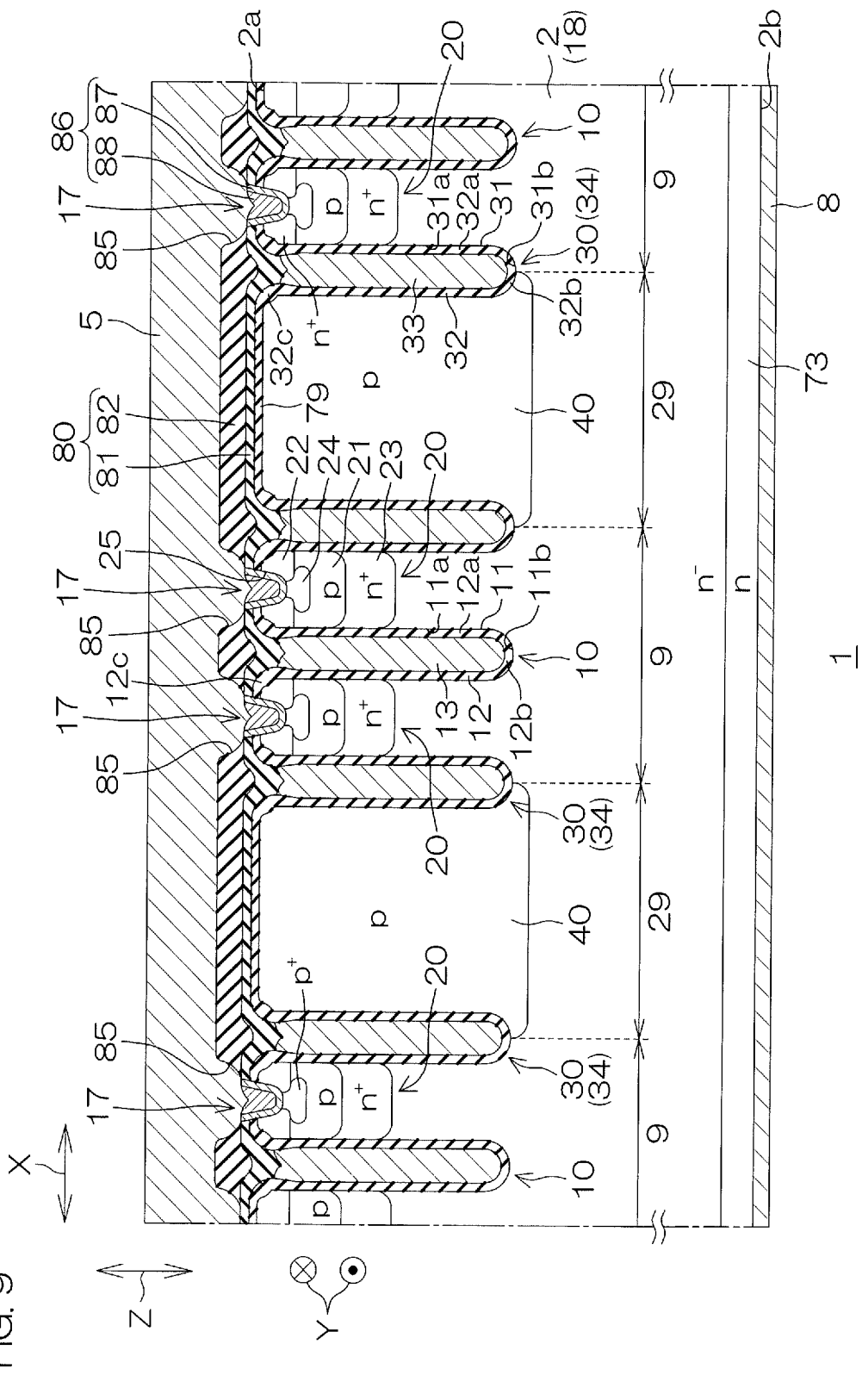
FIG. 9 is a sectional view for describing the construction of a semiconductor device according to a fifth embodiment of the present invention.

FIG. 9 is a sectional view for describing the construction of a semiconductor device 1 according to a fifth embodiment of the present invention, illustrating the construction corresponding to that shown above in FIG. 3. In this embodiment, the semiconductor device 1 is a FET semiconductor device of MIS (Metal-Insulator-Semiconductor) type with the collector region 71 omitted from the construction shown in FIG. 3. In this case, the term "emitter" is replaced with "source" and the term "collector" is replaced with "drain" in the above description related to the first embodiment. An n$^{+}$-type contact layer 73 for ohmic contact is preferably provided between the drain electrode 8 and the semiconductor layer 2.

While specific embodiments of the present invention have thus been described, the invention is not limited to these embodiments. In the above embodiments, the first conductivity type is the n-type, and the second conductivity type is the p-type by way of example. Alternatively, the first conductivity type may be the p-type, and the second conductivity type may be the n-type. In this case, specific constructions can be provided by replacing the n-type regions with p-type regions and replacing the p-type regions with n-type regions in the above description and the attached drawings.

The first embodiment and the like provide the construction in which the single linear outer isolation trench structure 50 is opposed to the region isolation trench structure 30. The second embodiment and the like provide the construction in which the two linear outer isolation trench structures (i.e., the first and second outer isolation trench structures 51, 52) are opposed to the region isolation trench structure 30. The number of the outer isolation trench structures opposed to the region isolation trench structure 30 may be three or more.

While the embodiments of the present invention have been described in detail, it should be understood that these embodiments are merely illustrative of the technical principles of the present invention but not limitative of the invention. The spirit and scope of the present invention are to be limited only by the appended claims.

This application claims the benefit of priority to Japanese Patent Application No. 2019-104630 filed on Jun. 4, 2019. The entire contents of this application are incorporated herein by reference.

DESCRIPTION OF REFERENCE CHARACTERS

1 Semiconductor device
2 Semiconductor layer

2a First main surface
2b Second main surface
3 Active region
4 Outer region
5 Emitter electrode (Source electrode)
6 Gate electrode
8 Collector electrode (Drain electrode)
9 FET Structure region
10 Trench gate structure
15 Outer trench gate structure
16 Connection trench gate structure
20 FET structure
29 Region isolation structure
30 Region isolation trench structure
31 Trench
32 Insulation layer
33 Electrode layer
34 Main isolation trench structure
34A Main isolation trench structure extension portion (Link-
age trench structure)
35 End connection trench structure
36 Intermediate connection trench structure
37 Isolation lead electrode layer
38 Isolation trench contact
40 Floating region
45 Main junction region
49 Region separation structure
50 Outer isolation trench structure
51 First outer isolation trench structure
52 Second outer isolation trench structure
53 First outer linkage trench structure
54 Second outer linkage trench structure
55 Semiconductor region
56 Semiconductor region
60 Intervening region
61 Well region
67 Isolation lead electrode layer
68 Isolation trench contact
79 Main surface insulation layer
80 Interlevel insulation layer
85 Emitter contact opening
90 Gate contact opening
93 Region isolation contact opening
96 Main junction contact opening
97 Region isolation contact opening

The invention claimed is:

1. A semiconductor device comprising:
a semiconductor layer of a first conductivity type having
a first main surface on one of opposite sides thereof and
a second main surface on the other side thereof;
an active region disposed in a surface layer of the first
main surface of the semiconductor layer;
an outer region disposed outside the active region in the
surface layer of the first main surface of the semicon-
ductor layer;
a main junction region of a second conductivity type
provided in the outer region, the main junction region
having an endless shape surrounding the active region
as viewed in plan;
a floating region of the second conductivity type provided
in an electrically floating state in the active region;
a region isolation trench structure which isolates the
floating region in the surface layer of the first main
surface of the semiconductor layer;
an outer isolation trench structure disposed in spaced
relation from the region isolation trench structure, the main junction region being provided outward of the
outer isolation trench structure; and
an intervening region disposed between the region isola-
tion trench structure and the outer isolation trench
structure to intervene between the main junction region
and the floating region.

2. The semiconductor device according to claim 1,
wherein a width of the intervening region from the region
isolation trench structure to the outer isolation trench struc-
ture is greater than a width of the region isolation trench
structure.

3. The semiconductor device according to claim 1, further
comprising a linkage trench structure which continuously
connects the region isolation trench structure to the outer
isolation trench structure.

4. The semiconductor device according to claim 1,
wherein the region isolation trench structure and the outer
isolation trench structure are separated from each other.

5. The semiconductor device according to claim 1,
wherein the outer isolation trench structure comprises a
first outer isolation trench structure spaced from the
region isolation trench structure and a second outer
isolation trench structure spaced from the first outer
isolation trench structure, the main junction region
being provided outward of the second outer isolation
trench structure, and
wherein the intervening region comprises a region present
between the first outer isolation trench structure and the
second outer isolation trench structure.

6. The semiconductor device according to claim 5,
wherein the outer isolation trench structure further com-
prises an outer linkage trench structure which connects the
first outer isolation trench structure and the second outer
isolation trench structure to each other, and has a ring shape
as viewed in plan perpendicularly to the first main surface.

7. The semiconductor device according to claim 1, further
comprising an electrode to which the region isolation trench
structure and the outer isolation trench structure are com-
monly connected.

8. The semiconductor device according to claim 7, further
comprising an isolation trench contact provided in the
floating region as viewed in plan for connecting the region
isolation trench structure and the outer isolation trench
structure to the electrode.

9. The semiconductor device according to claim 1,
wherein the intervening region is of the first conductivity
type.

10. The semiconductor device according to claim 1,
wherein the intervening region comprises a well region
having a higher second conductivity type impurity
concentration than the semiconductor layer and
exposed in the first main surface, and
wherein the well region has a bottom portion located at a
shallower position than bottom portions of the region
isolation trench structure and the outer isolation trench
structure.

11. The semiconductor device according to claim 1,
wherein the region isolation trench structure comprises a
region isolation trench provided in the first main surface of
the semiconductor layer, a region isolation insulation layer
provided on an inner surface of the region isolation trench,
and a region isolation electrode layer buried in the region
isolation trench with the intervention of the region isolation
insulation layer.

12. The semiconductor device according to claim 1,
wherein the outer isolation trench structure comprises an
outer isolation trench provided in the first main surface of the semiconductor layer, an outer isolation insulation layer provided on an inner surface of the outer isolation trench, and an outer isolation electrode layer buried in the outer isolation trench with the intervention of the outer isolation insulation layer.

13. The semiconductor device according to claim 1, wherein a FET (Field Effect Transistor) structure region is provided on a side of the region isolation trench structure opposite from the floating region.

14. The semiconductor device according to claim 13, further comprising a trench gate structure provided in the FET structure region in the first main surface of the semiconductor layer.

15. The semiconductor device according to claim 14, further comprising a collector region of the second conductivity type provided in a surface layer of the second main surface.

16. The semiconductor device according to claim 1, wherein the floating region has a bottom portion located at a deeper position from the first main surface than the region isolation trench structure.

17. The semiconductor device according to claim 1, wherein the main junction region has a bottom portion located at a deeper position from the first main surface than the outer isolation trench structure.

*   *   *   *   *